(12) United States Patent
Masuda

(10) Patent No.: US 9,896,279 B2
(45) Date of Patent: Feb. 20, 2018

(54) TRANSFER APPARATUS

(71) Applicant: Ueno Seiki Co., Ltd., Onga-gun, Fukuoka (JP)

(72) Inventor: Takayuki Masuda, Fukuoka (JP)

(73) Assignee: UENO SEIKI CO., LTD., Fukuoka (JP)

( * ) Notice: Subject to any disclaimer, the term of this patent is extended or adjusted under 35 U.S.C. 154(b) by 0 days.

(21) Appl. No.: 15/494,847

(22) Filed: Apr. 24, 2017

(65) Prior Publication Data

US 2017/0225906 A1    Aug. 10, 2017

Related U.S. Application Data

(63) Continuation of application No. PCT/JP2016/085552, filed on Nov. 30, 2016.

(30) Foreign Application Priority Data

Dec. 11, 2015    (JP) ................ 2015-242078

(51) Int. Cl.
B65G 29/00     (2006.01)
B65G 47/74     (2006.01)
(Continued)

(52) U.S. Cl.
CPC ................ B65G 47/848 (2013.01)

(58) Field of Classification Search
None
See application file for complete search history.

(56) References Cited

U.S. PATENT DOCUMENTS 5,220,993 A    6/1993  Scarpa et al.
7,052,564 B2 *  5/2006  Tandle ............... H05K 13/021
                                                  156/200

(Continued)

FOREIGN PATENT DOCUMENTS

JP    2667712 B2    10/1997
JP    2000-315856 A  11/2000
(Continued)

OTHER PUBLICATIONS

International Search Report, dated Feb. 28, 2017, for International Application No. PCT/JP2016/085552.
(Continued)

Primary Examiner — Kavel Singh
(74) Attorney, Agent, or Firm — Shapiro, Gabor and Rosenberger, PLLC

(57) ABSTRACT

This apparatus includes a carrying path for an electronic component, a holder unit holding and releasing the electronic component, and N number of rotary pickups including the multiple holder units, and intermittently rotating around the rotation axis. At least one of the rotary pickups is a first carrying structure. The rotary pickup adjacent to the first carrying structure is a second carrying structure installed so as to not overlap with each other, to have the respective rotation axes orthogonal to each other. The holder unit of the first carrying structure and that of the second carrying structure are each a sucking nozzle. The holder units of the first carrying structure and of the second carrying structure have a common stop position, and the electronic component is transferred at only a transfer point that is the stop position.

6 Claims, 13 Drawing Sheets

(51) Int. Cl.
*B65G 47/80* (2006.01)
*B65G 47/84* (2006.01)

(56) References Cited

U.S. PATENT DOCUMENTS

| | | | |
|---|---|---|---|
| 7,975,877 B2* | 7/2011 | Garthaffner | A24D 3/0216 |
| | | | 221/175 |
| 7,987,968 B2* | 8/2011 | Kobayashi | G01R 31/013 |
| | | | 198/397.03 |
| 9,583,338 B2* | 2/2017 | Hashimoto | C23C 16/45544 |
| 2003/0161711 A1 | 8/2003 | Kwan | |

FOREIGN PATENT DOCUMENTS

| | | |
|---|---|---|
| JP | 2003-252429 A | 9/2003 |
| JP | 2004-010254 A | 1/2004 |
| JP | 2009-194333 A | 8/2009 |
| JP | 2011-066277 A | 3/2011 |
| JP | 5376386 B1 | 12/2013 |
| JP | 5544461 B1 | 7/2014 |
| WO | WO 2013/108366 A1 | 7/2013 |
| WO | WO 2013/108367 A1 | 7/2013 |
| WO | WO 2014/087682 A1 | 6/2014 |

OTHER PUBLICATIONS

Office Action, dated Apr. 19, 2016, for Japanese Patent Application No. 2015-242078.

* cited by examiner

TRANSFER APPARATUS

TECHNICAL FIELD

The present invention relates to a transfer apparatus which picks up an electronic component from one storage unit, and places this electronic component in another storage unit.

BACKGROUND ART

Conventionally, transfer apparatuses, which pick up an electronic component from a storage unit, place this electronic component on a carrying path, process the electronic component at each process point set on the carrying path, and eventually place the processed electronic component in another storage unit, have been proposed, and are in practical use in manufacturing processes of electronic components.

Example electronic components are a component applied to electrical products, and include semiconductor elements. Example semiconductor elements are a transistor, an LED, an integrated circuit, and further includes a resistor and a capacitor. Example storage units are a wafer sheet, a lead frame, an organic-based substrate, an inorganic-based substrate, an adhesive tray, a substrate, a parts feeder, and sorting bottles such as a tape provided with pockets, a tray, and a packing container. Example processes for electronic components at the each process points are a visual inspection, an adhesive application, an attitude check, a sorting, a forcible ejection of defective products, a mounting on a substrate, an electrical characteristic inspection, a temperature adjustment like heating or cooling, a shaping of a terminal extended from an electronic component, an attitude correction, and a marking, which are variable processes.

In particular, a transfer apparatus, which picks up a semiconductor element from a wafer sheet, a tray, a tape, or a parts feeder, turns over the picked-up electronic component, and bonds this electronic component to a lead frame or a mount substrate by an applied adhesive, is called a die bonder apparatus.

An example known type of such transfer apparatus includes pluralities of rotary tables and rotary pickups, supplies an electronic component by the rotary pickup, and transfers the electronic component at a position where holder units installed on the rotary table are arranged on a straight line, thereby forming a single carrying path (see, for example, Patent Documents 1 to 3).

A difference between the rotary table and the rotary pickup will be clarified below. Firstly, the rotary table is, for example, a turret table that is applied as a main carrying path. Secondly, in comparison with the rotary pickup, the rotary table has large size and weight in order to install a large number of process points for an electronic component. Thirdly, since a process unit that processes the electronic component is installed below the process point, the rotary table has holding means for holding the electronic component hanged so as to be orthogonal to the table plane. In contrast, firstly, the rotary pickup is applied to supply an electronic component to the main carrying path, and conventionally does not form a part of the main carrying path. Secondly, in comparison with the rotary table, the rotary pickup has small size and weight. Thirdly, the holding means for holding the electronic component is installed in parallel with the rotation plane, and the leading end of the holding means is always directed outwardly. That is, the rotary pickup is to supply the electronic component to the rotary table, while the rotary table forms the main carrying path for electronic components. Hence, the rotary table and the rotary pickup have different applications, types, and dimensions.

The transfer apparatus disclosed in Patent Document 1 includes a pickup unit and a rotary table. The pickup unit and the rotary table each have pluralities of nozzles installed along the circumference so as to extend in the orthogonal direction to the circumference plane. Those pickup unit and rotary table are installed in the vertical direction so as to have respective overlapped outer circumferences, and transfers an electronic component between the overlapped portions. The pickup unit can turn over the nozzle by 180 degrees along with a horizontal rotation, receive an electronic component at the lower stage, and transfers the electronic component to the rotary table at the upper stage, thereby achieving a turn-over process.

In addition, according to the transfer apparatus disclosed in Patent Document 2, three or more rotary tables with different sizes are installed horizontally, and the holder units extend in the orthogonal direction to the circumference plane. This transfer apparatus also has the rotary tables installed in the vertical direction, and has overlapped portions at the outer circumferences.

According to the transfer apparatus disclosed in Patent Document 3, the holding unit that is a large-size rotary table is installed horizontally, while at the same time, the sucking unit that is a small-size rotary pickup is installed vertically. According to this transfer apparatus, also, the sucking unit is to supply an electronic component to the holding unit, and the holding unit is to receive the electronic component from the supply unit, and forms the main carrying path for the electronic component. Hence, those have different applications, types, and dimensions. However, this transfer apparatus also has the holding unit and the sucking unit installed in the vertical direction, and has overlapped portions at the outer circumferences.

As explained above, according to conventional transfer apparatuses that utilize the rotary table, the plurality of rotary tables are provided, and an electronic component is transferred at the position where the holder units provided on the respective rotary tables are arranged on a straight line. Accordingly, a type that forms a single carrying path inevitably has an overlap between the rotary tables.

As for transfer apparatuses, it is necessary to execute various types of processes, and an installation of a large number of process points on the carrying path may be desired. However, a location where the rotary tables overlap with each other has physical obstacles, such as the other rotary table and a motor, and an installation of the process point at such locations is difficult. Accordingly, when an attempt to install a large number of process points is made, an increase in dimension of the rotary table is unavoidable. In this case, a large space to install such transfer apparatus is necessary.

When the dimension of the rotary table increases, in order to achieve the rotation speed of the rotary table to be equal to or faster than a certain speed, a large motor is necessary. Hence, the necessary space to install the transfer apparatus further increases. In addition, when a large motor is not applied, the rotation speed of the rotary table inevitably decreases.

CITATION LIST

Patent Literatures

Patent Document 1: JP 2000-315856 A
Patent Document 2: Japan Patent No. 2667712

Patent Document 3: JP 2011-66277 A
Patent Document 4: International Publication WO2014/087682

SUMMARY OF INVENTION

Technical Problem

As explained above, according to the transfer apparatuses that have the plurality of overlapped rotary tables installed in the vertical direction, the downsizing and the increase in number of process points are in a trade-off relationship.

In order to address this technical problem, as illustrated in FIG. 13, a transfer apparatus which has a plurality of small-size rotary pickups L, which are installed so as to have the rotation plane in the vertical direction, in the horizontal direction without an overlap between a storage unit S1 that is a supply side of an electronic component W and a storage unit S2 that is a collecting side of the electronic component W.

According to this transfer apparatus, when a holder unit H provided on the rotary pickup L transfers the electronic component W to the adjacent rotary pickup L, the electronic component W is transferred from the supply side to the collecting side. The carrying path for the electronic component W is an upper or lower circular arc portion of each rotary pickup L.

As explained above, by increasing the number of rotary pickups L, the number of process points is increased. In addition, since the rotation plane of the rotary pickup L is in the vertical direction, the space in the parallel direction to the axis can be downsized.

According to this transfer apparatus, however, in order to enable each rotary pickup L to transfer the electronic component in sequence to the adjacent rotary pickup L, two transfer points are necessary. In addition, the carrying path for the electronic component W is only the upper half circular portion or lower half circular portion of each rotary pickup L. Hence, when, for example, the upper half circular portion is utilized as the carrying path, installation of various process units around a lower half circular portion X is difficult.

Hence, the available space for the process points are only the upper space of each rotary pickup L. In this case, in order to avoid an interference between the adjacent rotary pickups L, an increase of only one process point per a rotary pickup L is merely expectable.

On the other hand, every time the rotary pickup is additionally installed, the installation space in the horizontal direction orthogonal to the rotation axis increases. Hence, the ratio of an increase in number of process points relative to an increase in installation space decreases.

The present invention has been proposed in order to address the foregoing technical problems of conventional technologies, and an objective is to provide a transfer apparatus capable of remarkably increasing a ratio of an increase in number of process points relative to an increase in number of installed rotary pickups.

Solution to Problem

A transfer apparatus according to the present invention to address the foregoing technical problem includes a carrying path for an electronic component, formed between a first storage unit and a second storage unit, a holder unit holding and releasing the electronic component via a tip, and N number (where N ≥2) of rotary pickups including a plurality of the holder units around a rotation axis, and intermittently rotating around the rotation axis by a predetermined angle so as to always direct the tip of the holder outwardly.

In addition, according to the present invention, at least one of the rotary pickups is a first carrying structure that is a part of the carrying path, the rotary pickup adjacent to the first carrying structure is a second carrying structure installed so as not to overlap with each other, to have the respective rotation axes orthogonal to each other, and to form another part of the carrying path, the holder unit of the first carrying structure and the holder unit of the second carrying structure are each a sucking nozzle having an axis along a radial direction of the rotary pickup, and the respective tips of the holder units of the first carrying structure and of the second carrying structure have a common stop position facing with each other, and transferring the electronic component only at a transfer point that is the stop position.

The holder unit may be provided to be capable of moving forward in a centrifugal direction going apart from a center of the rotary pickup, and of retracting in a centripetal direction directed toward the center.

Either one of or both of the storage units may be a wafer sheet on which the electronic component is attached.

Either one of or both of the storage units may be a tape formed with a pocket.

The first carrying structure may be installed laterally, and a rotation trajectory of the holder unit may be horizontal.

The first carrying structure may be installed longitudinally, and a rotation trajectory of the holder unit may be vertical.

A process unit that performs a predetermined process on the electronic component may be installed to at least one stop position for the holder unit of the second carrying structure.

According to the present invention, a transfer apparatus taking out an electronic component from a first storage unit and placing in a second storage unit, in which:

both of the storage units are a wafer sheet on which the electronic component is attached;

the transfer apparatus includes:

a pair of support units including a ring moving unit capable of positioning a ring holder attached with a wafer ring holding the wafer sheet in X, Y, and θ axis directions in parallel with a plane of the wafer sheet, the pair of support units being installed at adjacent locations such that both of the wafer sheets are vertical to an installation plane, and the wafer sheets are orthogonal to each other;

an imaging optical system picking up an image of the electronic component attached on each of the wafer sheets of the pair of support units in order to obtain a positional displacement amount when the ring moving unit corrects a position of the electronic component;

a holder unit holding and releasing the electronic component via a tip; and a plurality of rotary pickups including a plurality of the holder units around a rotation axis, and intermittently rotating around the rotation axis by a predetermined angle so as to always direct the tip of the holder outwardly.

In addition, according to the present invention, the one rotary pickup is a main carrying structure forming a main carrying path for the electronic component from the first storage unit to the second storage unit, the main carrying structure is installed laterally, and a rotation trajectory of the holder unit is horizontal, the adjacent rotary pickup to the main carrying structure is a sub carrying structure installed in a vertical direction so as not to overlap with each other and so as to have respective rotation axes orthogonal to each other, the sub carrying structure is installed longitudinally, and a rotation trajectory of the holder unit is vertical to an installation plane, the sub carrying structure has a diameter of a rotation plane smaller than that of the main carrying structure, and the respective tips of the holder units of the main carrying structure and the sub carrying structure have a common stop position facing with each other, and the electronic component is transferred only at a transfer point that is the stop position.

A process unit that performs a predetermined process on the electronic component may be installed to at least one stop position for the holder unit of the sub carrying structure, and the process unit includes a correction unit correcting an attitude of the electronic component, and an inspection unit inspecting a characteristic of the electronic component.

The inspection unit may include at least one of an optical characteristic measuring unit having an integrating sphere, an electrical characteristic measuring unit, and a visual inspection unit.

Either one of the rotary pickups adjacent to each other in a direction in which the rotation axes are orthogonal to each other may further include a forward/retract drive unit, that moves forward the holder unit stopped at the stop position outwardly in a radial direction going apart from the rotation axis, installed at the stop position corresponding to the transfer point, and either one of the holder units facing with each other at the transfer point may feed or receive the electronic component to be transferred.

A plurality of the sub carrying structures may be provided.

Advantageous Effects of Invention

According to the present invention, the rotary pickup that is the second carrying structure is installed so as to not overlap the rotary pickup that is the first carrying structure and to have the tips of the respective holder units facing with each other in a direction in which respective rotation axes are orthogonal to each other. Hence, a surrounding space of the second carrying structure other than the transfer point becomes vacant. Therefore, the increase ratio of the number of process points relative to the increased number of rotary pickups is remarkably increased.

DESCRIPTION OF EMBODIMENTS

[1. Entire Structure]

Figure 1:
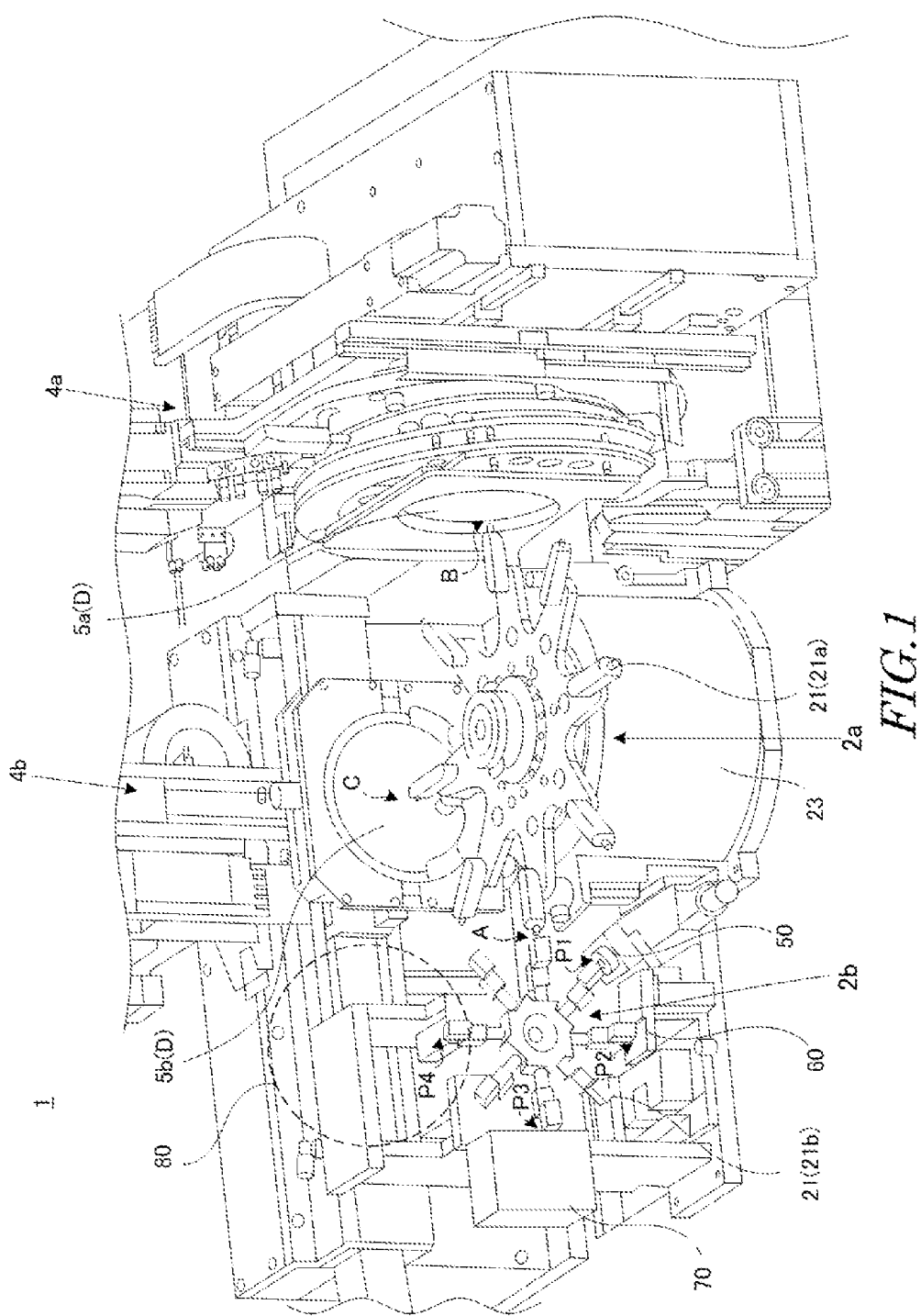
FIG. 1 is a perspective view illustrating an entire structure of a transfer apparatus according to an embodiment.
Figure 2:
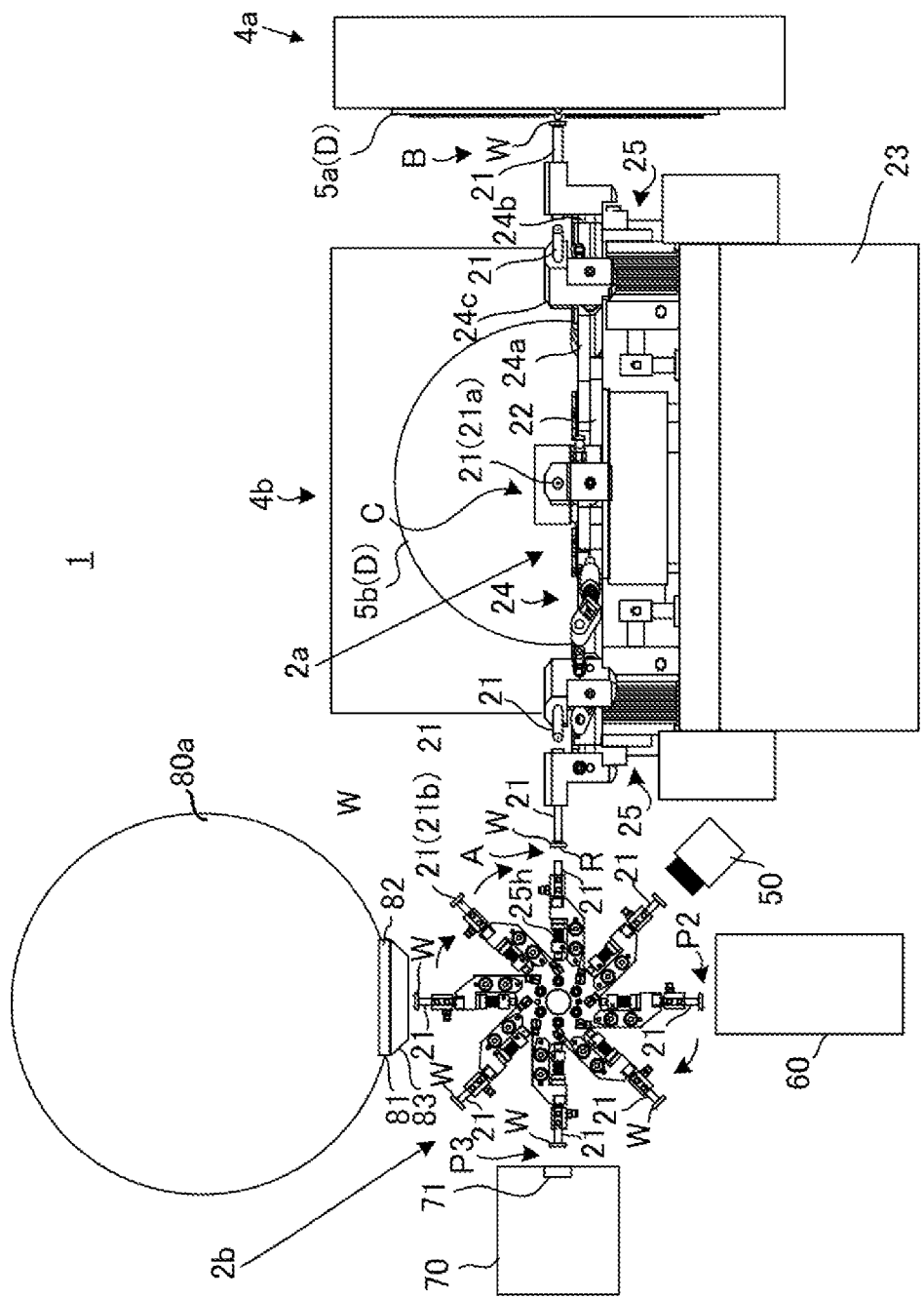
FIG. 2 is a side view illustrating an installation structure of the transfer apparatus according to the embodiment.

A transfer apparatus according to an embodiment of the present invention will be explained below in detail with reference to the figures. The present invention and the embodiment thereof can be in the forms of a sorting apparatus that sorts electronic components in accordance with a type and a ranking, an inspection apparatus or a measuring apparatus that inspects or measures various characteristics of the electronic component, a sorting-inspection apparatus or a sorting-measuring apparatus that has functions of sorting, and inspection or measurement. FIG. 1 is a perspective view illustrating an entire structure of a transfer apparatus 1 according to this embodiment, and FIG. 2 is a front view of the transfer apparatus 1. The transfer apparatus 1 picks up an electronic component W from a storage unit 5a, and places the picked-up electronic component W in another storage unit 5b that has gone through various process points.

The electronic component W is a part applied to electrical products, and includes, for example, a semiconductor element, and a resistor or a capacitor other than the semiconductor element. Example semiconductor elements are discrete semiconductors, such as a transistor, a diode, an LED, a capacitor, and a thyristor, and an integrated circuits, such as an IC and an LSI. The storage units 5a, 5b are each a wafer sheet, a lead frame, an organic-based substrate, an inorganic-based substrate, an adhesive tray, a board, a parts feeder, and sorting bottles such as a tape provided with pockets, a tray, or a packing container. In this embodiment, the electronic component W is picked up from a wafer sheet D of the one storage unit 5a, and attached on a wafer sheet D of the other storage unit 5b.

This transfer apparatus 1 includes rotary pickups 2a, 2b. The rotary pickup 2a is a main carrying structure that forms a main carrying path for the electronic component W from the one storage unit 5a to the other storage unit 5b. The rotary pickup 2b is a sub carrying structure that is installed adjacent to the main carrying structure, and in the direction in which respective rotation axes are orthogonal to each other so as not to overlap with each other. The carrying path for the electronic component W by the rotary pickup 2b forms the sub carrying path. The rotary pickups 2a, 2b carry the electronic components w along the respective outer circumferences by intermittent rotation.

The rotary pickups 2a, 2b each include a plurality of holder units 21 that hold and release the electronic component W via the tip. The plurality of holder units 21 are installed on the same circumference around the rotation axis at the equal pitch, extend along the radial direction from the circumference center, and installed so as to direct the tip outwardly in parallel with the circumference plane. The rotary pickups 2a, 2b intermittently rotate the holder units 21 holding the electronic component W by a predetermined angle around the rotation center that is an axis passing through the circumference center and orthogonal to the radial direction.

Both the rotary pickups 2a, 2b are installed adjacent to each other in such way that the respective installation planes for the holder units 21 are orthogonal to each other. In addition, the rotary pickups 2a, 2b have a common stop position where the tips of the respective holder units 21 face with each other, and the electronic component W is transferred in both directions at only this stop position that is a transfer point A. In this case, as for the transfer point A that is the only stop position, with respect to the relationship between the pair of rotary pickups 2a, 2b, the electronic component W is transferred only at this stop position. Hence, there may be other transfer relationship of the electronic component W with other apparatuses at the surrounding stop positions of the rotary pickups 2a, 2b. In addition, as will be explained later, when there are a plurality rotary pickups 2b, the transfer point A is present between the rotary pickup 2a and each rotary pickup 2b. Still further, the transfer in both directions means that the electronic component W that has transferred from the rotary pickup 2a to the rotary pickup 2b goes around the rotary pickup 2b, and is transferred again to the rotary pickup 2a. The transfer point A divides the main carrying path into the first half and the latter half.

At the transfer point A, the holder unit 21 (21a) of the rotary pickup 2a is holding a surface of the electronic component W via the tip. That is, an opposite surface R of the electronic component W is directed toward the holder unit 21 (21b) of the facing rotary pickup 2b at the transfer point A. The holder unit 21 (21b) holds the opposite surface R of the electronic component W via the tip, causes this electronic component W to go around together with the rotation of the rotary pickup 2b, and keeps holding this electronic component W up to the transfer point A where the facing holder unit 21 (21a) of the rotary pickup 2a is present.

In addition, there are no physical obstacles, which originate from an overlap of the rotary pickups 2a, 2b, at all stop positions other than the transfer point A for the holder unit 21. Hence, those stop positions are available as respective process points for the electronic component W.

For example, stage units 4a, 4b are installed at respective two process points of the rotary pickup 2a. The one stage unit 4a moves the storage unit 5a, which the electronic components W are picked up from, parallel in the X and Y axis direction, and positions the electronic components W in the storage unit 5a one by one to a pickup point B. The other stage unit 4b moves the storage unit 5b, which the electronic components W are mounted to, parallel in the X and Y axis direction, and positions places where the electronic components W are mounted to one by one to a release point C of the electronic component W.

The pickup point B is a stop position for the holder unit 21 closest to the storage unit 5a in the first half of the main carrying path. The release point C is a stop position for the holder unit 21 closest to the storage unit 5b in the latter half of the main carrying path. In this embodiment, the rotary pickup 2a is laterally installed, and the rotation trajectory of the holder unit 21 becomes horizontal to the installation plane. In addition, the one stop position in the first half of the main carrying path is the pickup point B, and the one stop position in the latter half of the main carrying path is the release point C.

The storage units 5a, 5b each include the wafer sheet D, and the stage units 4a, 4b are support units for the respective wafer sheets D. The stage units 4a, 4b are installed at locations where the respective wafer sheets D face the tip of the holder unit 21 in the orthogonal direction to the rotation radius of the rotary pickup 2a. That is, the wafer sheet D is vertical to the installation plane, and is installed in parallel with the tangent line direction of the rotation trajectory of the holder unit 21. In addition, the stage units 4a, 4b are located adjacent to each other in such way that the respective wafer sheets D are orthogonal to each other.

The other rotary pickup 2b is installed longitudinally, and the rotation trajectory of the holder unit 21b forming the sub carrying path is vertical to the installation plane. The process unit that executes a predetermined process to the electronic component W is installed at each stop position facing the tip of the holder unit 21a of the rotary pickup 2b. Example process units are an attitude measuring unit 50, a correction unit 60, an electrical characteristic measuring unit 70, and an optical characteristic measuring unit 80. The above rotary pickups 2a, 2b, the stage units 4a, 4b, attitude measuring unit 50, correction unit 60, electrical characteristic measuring unit 70, and optical characteristic measuring unit 80 are attached to a support frame that supports the entire apparatus, and a stage fastened thereto, etc.

[2. Detailed Structure]
(Rotary Pickup)

As illustrated in FIG. 1, FIG. 2, the rotary pickups 2a, 2b each basically employ the same structure. However, the rotary pickup 2b that is the sub carrying structure has a diameter of the rotation plane smaller than that of the rotary pickup 2a that is the main carrying structure. That is, since the rotary pickup 2b is smaller than the rotary pickup 2a, a longitudinal installation with little interference with other components is enabled.

The rotary pickups 2a, 2b each have the holder units 21 installed on the circumference around the axis of an axial frame 22 at an equal pitch so as to always direct the tip of the holder unit 21 outwardly. A motor 23 that is a drive source of the rotary pickup 2a, 2b intermittently rotates the axial frame 22, thereby simultaneously stopping all holder units 21 for each rotation angle. The holder unit 21 is installed on the axial frame 22 via an sliding unit 24, and is capable of moving forward outwardly along the radial direction of the rotary pickup 2a, 2b, that is, a centrifugal direction going apart from the center of the rotary pickup 2a, 2b, and a centripetal direction retracting toward a center. In addition, forward/retract drive units 25 that apply drive force for moving forward and retracting the holder unit 21 are installed at several stop positions for the holder unit 21. Example several stop positions are the pickup point B, the transfer point A, the release point C, a correction point P2, an electrical characteristic measuring unit P3, and an optical characteristic measuring point P4.

The holder unit 21 is, for example, a sucking nozzle that has an axis along the radial direction of the rotary pickup 2a, 2b. The sucking nozzle is a hollow cylinder that has an opened nozzle tip, and directs the nozzle tip outwardly in the pickup radial direction. In addition, the nozzle interior is connected with the pneumatic circuit of a vacuum generator via a tube. This sucking nozzle sucks the electronic component W by negative pressure generated by the vacuum generator, and releases the electronic component W by vacuum break or generation of positive pressure.

The axial frame 22 is a cylinder that has one end spreading in a substantially disk shape, is a support for the holder unit 21, and becomes a rotation axis coupled to the motor 23. The cylindrical portion of the axial frame 22 is coaxially fastened to the rotation shaft of the motor 23. More specifically, the rotation shaft of the motor 23 is fitted in the cylindrical portion of the axial frame 22, and is fastened thereto by, for example, bolts.

The motor 23 is, for example, a servo motor that has a rotation shaft, and alternately repeats a rotation by a certain angle, and a stop for a certain time period. This motor 23 causes any holder unit 21 to be located at the pickup point B, the release point C, and the transfer point A located right beside the holder unit 21.

The rotation angle of the motor 23 is equal to the installation pitch of the holder unit 21. For example, the eight holder units 21 are installed at the equal pitch on the circumference, and installed in such way that multiples of the installation pitch of the holder unit 21 includes 90 degrees. Hence, the holder unit 21 stops at the pickup point B, the release point C, and the transfer point A located right beside.

In addition, the time period at which the motor 23 stops the rotation corresponds to the longest time among a pickup time for the electronic component W including the movement of the stage, a transfer time, a time for taking a visual image, a position correcting time, an electrical characteristic measuring time, an optical characteristic measuring time, and a placing time including the movement of the stage.

The sliding unit 24 includes a sleeve 24a fastened to a stay extended around the disk portion of the axial frame 22, a slide shaft 24b passing completely through the sleeve 24a in a slidable manner in the pickup radial direction, and an arm 24c fastened to an outward end of the slide shaft 24b in the radial direction of the rotary pickup. The arm 24c is fastened so as to be orthogonal to the slide shaft 24b, extends in parallel with the rotation axes of the rotary pickups 2a, 2b, has one extended end protruding from the disk-portion surface of the axial frame 22, and has the other end extending to reach the back side of the disk-portion of the axial frame 22. The holder unit 21 is installed at the one end of the arm 24c protruding from the disk-portion surface of the axial frame 22 so as to extend along the radial direction of the rotary pickup 2a, 2b.

(Forward/Retract Drive Unit)

The forward/retract drive unit 25 is installed at the back side of the disk-portion of the axial frame 22 so as to apply drive force to a portion of the arm 24c reaching the back surface of the disk-portion at the pickup point B, the release point C, and the transfer point A. In addition, the forward/retract drive unit 25 is also installed at the correction point P2, the electrical characteristic measuring point P3 and the optical characteristic measuring point P4 that are the stop positions corresponding to the correction unit 60, the electrical characteristic measuring unit 70, and an integrating sphere 80. At the transfer point A, the forward/retract drive unit 25 may be installed on both the rotary pickups 2a, 2b, or may be installed on only one of the rotary pickups. However, a structure in which, at the transfer point A, the one holder unit 21 unilaterally approaches to the other holder unit 21 for the transfer of the electronic component W is employed. In addition, at least at the transfer point A, a control that decelerates the moving-forward speed of the one holder unit 21 as coming close to the electronic component W, and further decreases the load to the electronic component W to become close to zero is performed.

This forward/retract drive unit 25 applies thrust force that moves forward the holder unit 21 outwardly in the radial direction of the rotary pickup 2a, 2b, and thrust force that retracts the holder unit 21 toward the radial direction center. More specifically, the arm 24c to which the holder unit 21 is fastened is pushed outwardly in the radial direction, thereby moving forward the holder unit 21 fastened to the arm 24c. In addition, by cancelling the thrust force applied to the arm 24c, and producing pushing force to return the slide shaft 24b of the sliding unit 24 toward the radial direction center, the arm 24c fastened to the slide shaft 24b and the holder unit 21 are retracted.

Figure 3:
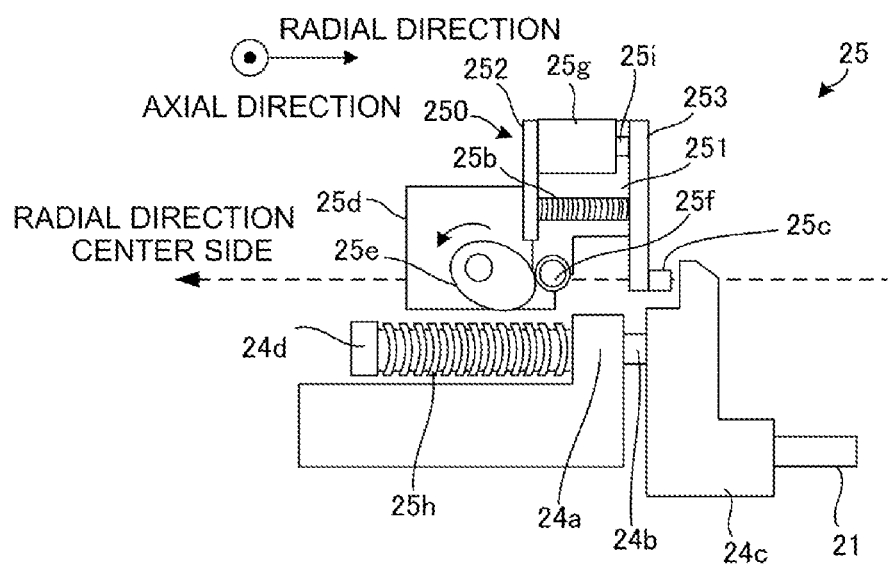
FIG. 3 is a perspective view illustrating a forward/retract drive unit.

More specifically, as illustrated in FIG. 3, the forward/retract drive unit 25 includes a slide member 25 movable in the pickup radial direction. This slide member 250 is a tabular member in an L shape. The one plate defining the L shape is a side plate 251 spreading in the pickup radial direction, and the other plate is a celling plate 252 spreading in the rotation axis direction of the rotary pickup 2a, 2b. The celling plate 252 is positioned at the radial-direction-center side of the rotary pickup than the side plate 251.

The slide member 250 is movable in the pickup radial direction. In addition, the celling plate 252 of the slide member 250 is coupled to a sheet of protrusion support plate 253 via a spring 25b so as to face with each other. The protrusion support plate 253 is positioned outwardly in the pickup radial direction than the celling plate 252, and a protrusion 25c is provided on the outward surface in the pickup radial direction. This protrusion 25c is located right above the portion of the arm 24c reaching the back surface of the axial frame 22.

According to such forward/retract drive unit 25, when the slide member 250 moves outwardly in the pickup radial direction, the protrusion 25c abuts the arm 24c, capable of moving forward the holder unit 21 outwardly in the radial direction of the rotary pickup via the arm 24c. In addition, the protrusion support plate 253 is movable outwardly in the pickup radial direction, so that the load applied to the electronic component W from the tip of the holder unit 21 is adjustable.

A drive force generating source to move the slide member 250 includes a rotation motor 25d, a cylindrical cam 25e, and a cam follower 25f. In addition, a drive force generating source to apply load to the protrusion support plate 253 includes a voice coil motor 25g.

The cam follower 25f is a cylindrical member, and is provided to stand upright on the side plate 251 of the slide member 250, extend in the rotation axis direction of the rotary pickup. The cylindrical cam 25e includes an axis that extends in the rotation axis direction of the rotary pickup, and this axis is supported by the rotation motor 25d that has a stationary position. The circumference surface of the cylindrical cam 25e is a cam surface that abuts the circumference surface of the cam follower 25f from the pickup radial-direction-center side. An expanded portion that increases the diameter of the cylindrical cam 25e is formed on the cam surface.

Hence, when the rotation motor 25d is actuated, the cylindrical cam 25e rotates, and when the cam follower 25f passes through the expanded portion of the cylindrical cam 25e, the distance between the rotation center of the cylindrical cam 25e and the cam follower 25f increases. Since the cylindrical cam 25e abuts the cam follower 25f from the pickup radial-direction-center side, the rotation center of the cylindrical cam 25e and the cam follower 25f increase the distance outwardly in the pickup radial direction. Hence, the cam follower 25f is pushed down outwardly in the pickup radial direction by the cylindrical cam 25e. Since the cam follower 25f is in a stationary relationship with the slide member 250, the slide member 250 is also pushed down outwardly in the pickup radial direction. Eventually, the protrusion 25c abuts the arm 24c, moving forward the holder unit 21.

The voice coil motor 25g is a liner motor that has a current and a thrust force in a proportional relationship, and includes a magnet, an annular coil, and a rod 25i coupled to the annular coil. The electro-magnetic mutual action between the current-carrying annular coil and the magnet generates Lorentz force at the annular coil, and thus the rod 25i is moved forward from a motor casing. This voice coil motor 25g is fastened to the celling plate 252, and is installed between the celling plate 252 and the protrusion support plate 253. The rod 25*i* extends outwardly in the pickup radial direction, and has a tip coupled to the protrusion support plate 253 from the pickup radial-direction-center side.

When the voice coil motor 25*g* is actuated and a thrust force countervailing the total of the compression force by the spring 25*b* and the reaction force applied from the arm 24*c* is applied, such thrust force is applied to the electronic component W via the protrusion support plate 253, the protrusion 25*c*, the arm 24*c*, and the tip of the holder unit 21. In addition, in a condition the holder unit 21 is not reached the electronic component W yet, when a thrust force countervailing the resistance force applied to the rod 25*i* is applied to the rod 25*i*, an impact produced when the holder unit 21 reaches the electronic component W is absorbed by the pushed-in rod 25*i*, and thus the load applied to the electronic component W becomes close to zero.

Still further, the forward/retract drive unit 25 includes, as a thrust force generating source to retract the holder unit 21, a spring 25*h* that pushes, toward the radial direction center of the rotary pickup 2*a*, 2*b*, the slide shaft 24*b* that fastens the holder unit 21 via the arm 24*c*. As illustrated in FIG. 3, this spring 25*h* has one end fastened to the seat that is an edge of the sleeve 24*a* of the sliding unit 24. The edge of the sleeve 24*a* where the spring 25*h* is fastened is an end at the radial-direction-center side of the rotary pickup 2*a*, 2*b*. In addition, the slide shaft 24*b* also protrudes from the sleeve 24*a* toward the radial-direction-center side, and a flange 24*d* is formed at the protruding portion. The other end of the spring 25*h* is fastened to the flange 24*d*.

Hence, when the slide shaft 24*b* is moved outwardly in the radial direction of the rotary pickup 2*a*, 2*b*, the spring 25*h* is compressed by a decrease in gap between the edge of the sleeve 24*a* and the flange 24*d* of the slide shaft 24*b*. When the thrust force in the forwarding direction is canceled, the spring 25*h* releases the accumulated pushing force by the compression, and retracts the holder unit 21 toward the pickup radial direction center of the rotary pickup 2*a*, 2*b* via the arm 24*c* and the slide shaft 24*b*.

The moving-forward amount of the holder unit 21 by the rotation motor 25*d* is managed by the encoder, and a point at which the tip of the holder unit 21 abuts the electronic component W, that is, the stop point for the holder unit 21 is set beforehand by detecting the resistance force applied to the rod 25*i* by the voice coil motor 25*g*. By adjusting the moving-forward amount of the holder unit 21, the holder unit 21 is capable of moving at a fast speed, and is prevented from applying excessive load to the electronic component W.

That is, after both the rotary pickups 2*a*, 2*b* are installed, the holder unit 21*b* is moved forward outwardly in the pickup radial direction at the transfer point A. When the holder unit 21*b* moves forward, thrust force countervailing the total of the compression force by the spring 25*b* and the resistance force applied from the arm 24*c* is applied to the rod 25*i*. When the electronic component W is held between the holder units 21*a*, 21*b*, the rod 25*i* receives new resistance force from the electronic component W, and attempts to move in the push-in direction. The new resistance force corresponds to the weight of the rod 25*i* and the friction force by pushed-in. The moment at which the rod 25*i* moves in the push-in direction is detected, and the rotation amount of the rotation motor 25*d* at the time of detection is stored in association with combination information on the facing holder units 21*a*, 21*b*, or the stop point information on the transfer point A, etc. In the adjustment of the moving-forward amount, it is unnecessary to use the actual electronic component W, and a simulation mock may be applied.

(Stage Unit)

The stage unit 4*a* is a unit that supports the wafer sheet D on which the wafer having the electronic components W with different quality rankings mixed are attached, and which has the electronic components W divided into pieces by dicing. The stage unit 4*b* is a unit that supports the wafer sheet D on which the electronic components W with the same ranking are selectively attached.

Figure 4:
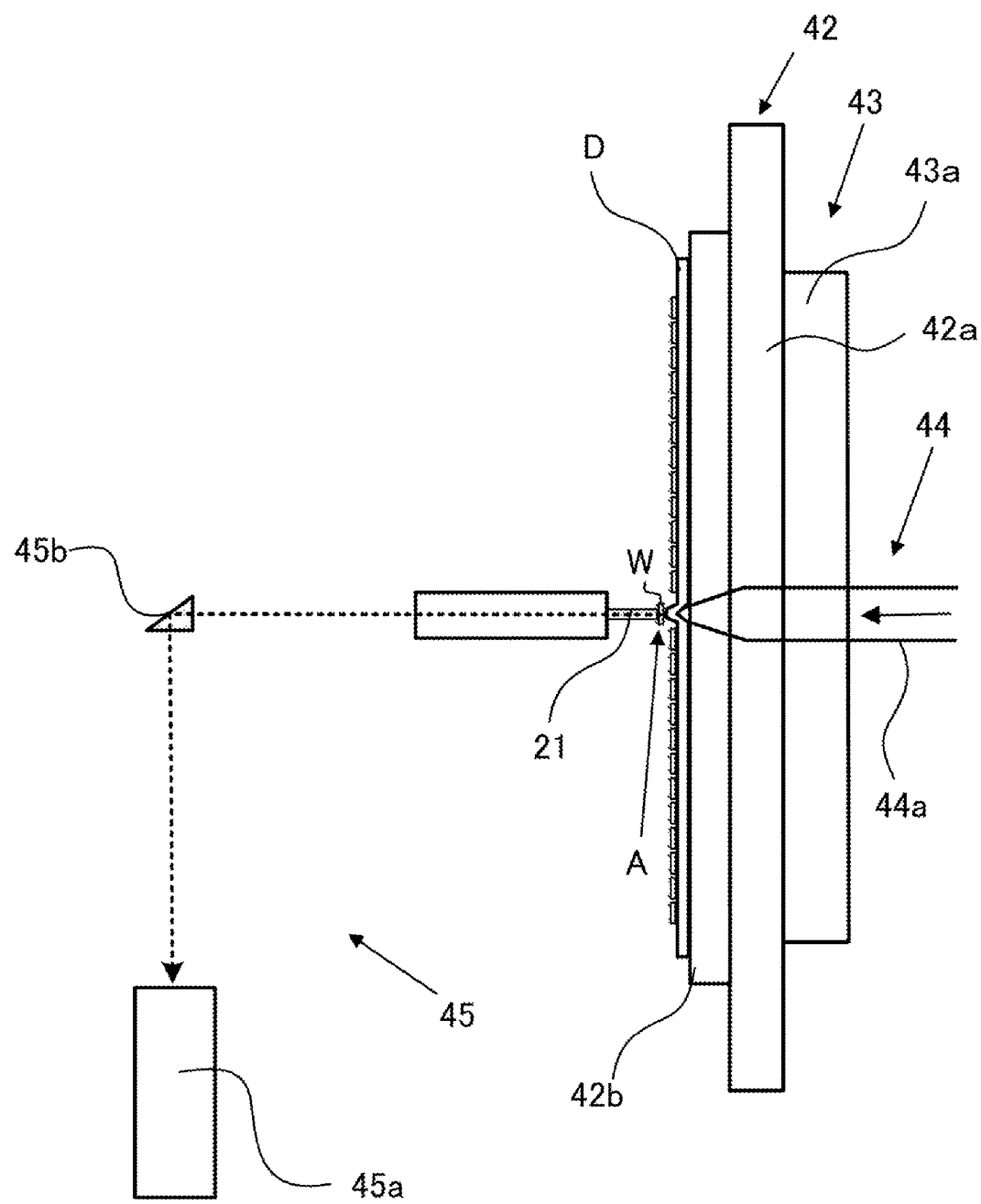
FIG. 4 is a schematic side view of a support unit for a wafer sheet.

The stage units 4*a*, 4*b* basically employ the same structure, and as illustrated in FIG. 4, include a ring moving unit 42, an expansion unit 43, and a separation unit 44.

The ring moving unit 42 is a unit that moves a wafer ring 42*b* attached to a ring holder 42*a* in a predetermined direction.

Figure 5:
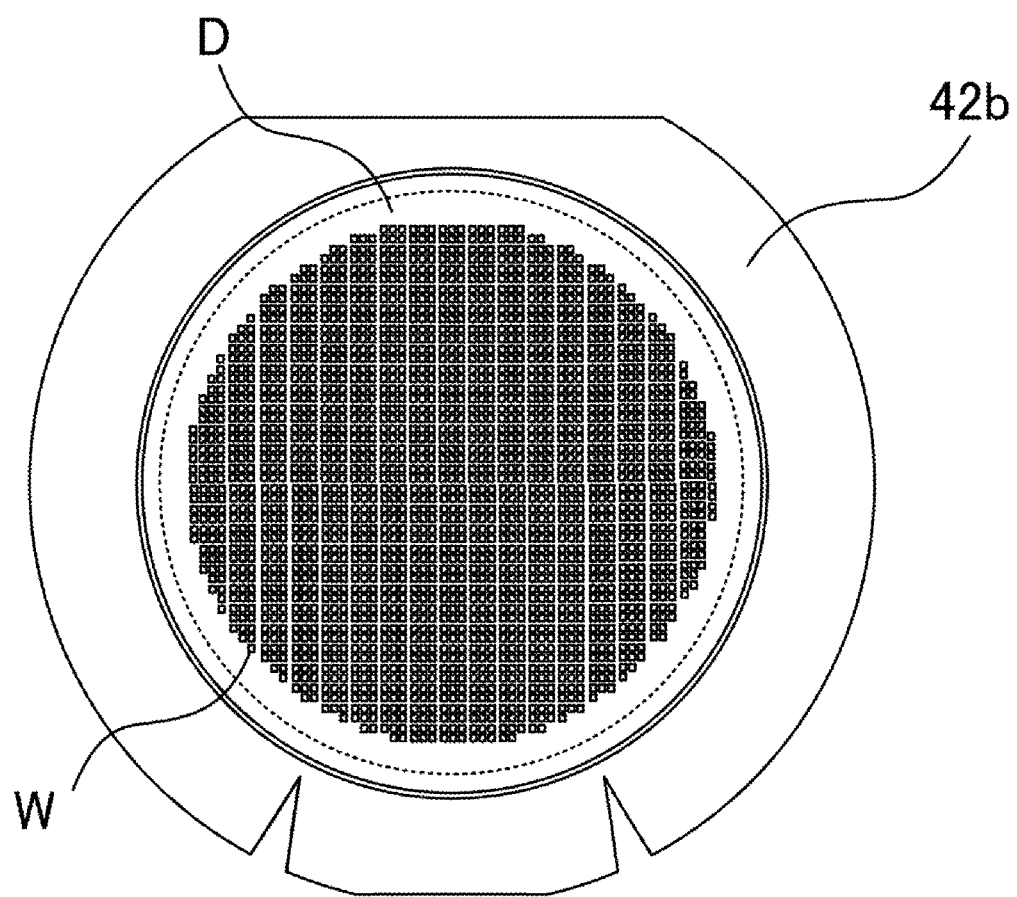
FIG. 5 is a plan view illustrating a wafer ring.

As illustrated in FIG. 5, the wafer ring 42*b* is a member in a plate shape on which the wafer sheet D is attached and which holds such wafer sheet D so as to cover the inward circular hole. A wafer is attached on the wafer sheet D on the stage unit 4*a*. In addition, the wafer is cut into the plurality of electronic components W by dicing.

The ring moving unit 42 is provided so as to position the ring holder 42*a* in the X-axis direction and in the Y-axis direction both in parallel with the plane of the wafer sheet D along unillustrated guide rails, etc. In addition, the ring moving unit 42 is also provided so as to position the ring holder 42*a* in a θ-axis direction in parallel with the plane of the wafer sheet D by, for example, a belt and a pulley that transmit drive force by an unillustrated motor.

The expansion unit 43 expands the wafer sheet D, thereby forming a gap between the electronic components W. This expansion unit 43 includes a cylindrical pull unit 43*a*. The pull unit 43*a* expands the wafer sheet D in the following scheme. First, one end of the cylindrical pull unit 43*a* is pushed against the side opposite to the surface of the wafer sheet D on which the electronic components W are attached from the back side of the wafer ring 42*b*.

Next, the pull unit 43*a* holds the wafer sheet D between the outer circumference of the pull unit 43*a* and the inner circumference of the circular opening of the wafer ring 42*b*, and moves so as to protrude toward the front surface side of the wafer ring 42*b*. This causes the wafer sheet D to be expanded by force directed from the internal side of the circle encircling the electronic components W to the external side thereof. The pull unit 43*a* is provided so as to move forward and retract by an unillustrated cylinder, etc., in order to achieve such actions.

The separation unit 44 is a unit that separates the individual electronic component W. This separation unit 44 has a pin 44*a* that faces the electronic component W with the wafer sheet D being present therebetween. This pin 44*a* is provided so as to be movable in a direction of pushing the electronic component W coming to the facing position by the tip via the wafer sheet D in accordance with the movement by the ring moving unit 42. Although it is not illustrated in the figure and not explained below, the stage units 4*a*, 4*b* each include an auto loader that is a replacing unit which replaces the wafer sheet D.

In addition, an imaging optical system 45 that takes the image of the electronic component W is provided near the stage unit 4*a*, 4*b*. The imaging optical system 45 is a unit that takes the image of the wafer sheet D and the electronic component W. The imaging optical system 45 includes an imaging unit 45*a*, and an optical member 45*b*. The imaging unit 45*a* is a camera which takes the image of the electronic component W on the wafer sheet D, and outputs image data. The optical member 45*b* is a prism that converts the direction of the optical axis so as to guide the image of a surface of the electronic component W on the wafer sheet D to the imaging unit 45a.

At the time of pickup action by the rotary pickup 2a that is the main carrying structure, the imaging optical system 45 takes the image of the target electronic component W, and calculates a positional displacement amount relative to a predetermined imaging area. Next, the ring moving unit 42 moves the ring holder 42a in the X, Y, and θ axis directions so as to eliminate the positional displacement to correct the position, and then the electronic component W is picked up.

(Attitude Measuring Unit)

The attitude measuring unit 50 is a unit that measures an attitude displacement of the electronic component W at the downstream side relative to the transfer point A in the sub carrying path. The attitude measuring unit 50 includes an imaging optical system that takes the image of the electronic component W at the next stop position to the transfer point A. The attitude measuring unit 50 takes the image of the electronic component W held by the holder unit 21 by the imaging optical system, and detects, by the image processing, the attitude displacement of the electronic component W, i.e., the positional displacement represented by the X and Y axis directions, and the directional displacement represented by the θ-axis direction. That is, the attitude measuring unit 50 includes an imaging unit that takes the image of the electronic component W, and the arithmetic processing unit that detects the attitude displacement of the electronic component W by the image processing. The attitude includes the position and the direction.

The attitude displacement means the positional displacement and the directional displacement relative to the holding reference point at the holder unit 21. An example reference point is the center point of the sucking area of the sucking nozzle. The X and Y axis directions represent directions in which the sucking surface of the electronic component W spreads. The attitude measuring unit 50 outputs information on measurement results that are the positional displacement amount of the electronic component W in the X-axis direction, the positional displacement amount in the Y-axis direction, and the directional displacement amount around the θ-axis direction. The orthogonal direction to the sucking surface of the electronic component W is identified as a Z-axis direction. The holder unit 21 that moves forward and retracts in the radial direction of the rotation body as explained above moves forward and retracts the electronic component W in the Z-axis direction.

(Correction Unit)

The correction unit 60 is a unit that corrects the attitude of the electronic component W based on the measured attitude displacement by the attitude measuring unit 50 at the downstream side relative to the attitude measuring unit 50 in the sub carrying path. The correction unit 60 is installed at the next stop position to the attitude measuring unit 50. As illustrated in FIG. 2, this is a location right below the rotary pickup 2b. The correction unit 60 moves the electronic component W in the X and Y axis directions so as to eliminate the attitude displacement, and rotates the electronic component W around the θ-axis direction based on the positional displacement amount and on the directional displacement amount. Hence, the correction unit 60 corrects the attitude of the electronic component W.

Figure 6A:
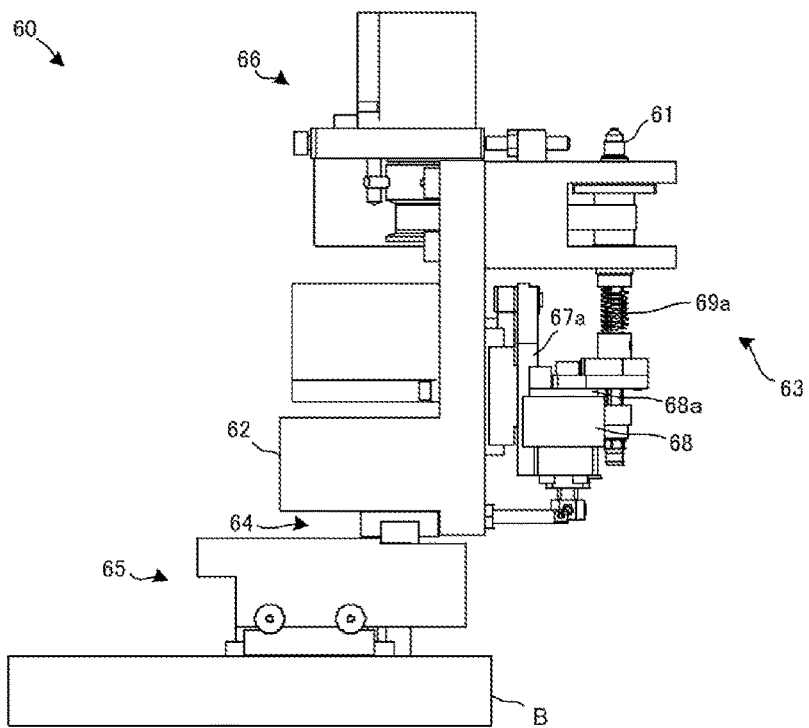
FIG. 6(a) is a side view of a correction unit.
Figure 6B:
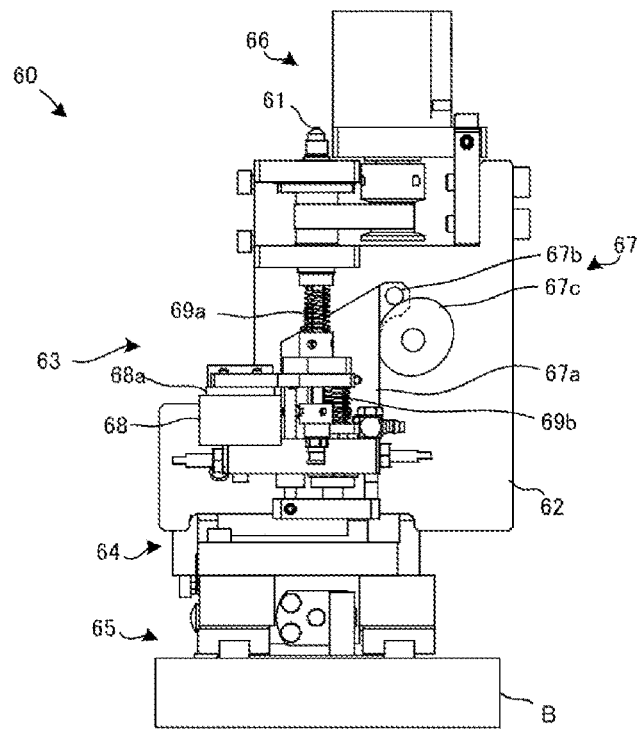
FIG. 6(b) is a plan view thereof.

FIG. 6 illustrates a detailed structure of this correction unit 60. FIG. 6(a) is a side view, while FIG. 6(b) is a plan view. The correction unit 60 includes a collet 61 and a mount 62 both provided on a base B. The base B is provided on the transfer apparatus 1 so as to stand upright in the vertical direction. A Z-axis movement unit 63 that moves the collet 61 in the Z-axis direction is mounted on the mount 62. The collet 61 is mounted on the mount 62 via the Z-axis movement unit 63.

In addition, the mount 62 includes an X-axis movement unit 64 and a Y-axis movement unit 65 each including a slider that slides over a rail, and is movable in the X-axis direction and in the Y-axis direction. Still further, a θ-axis rotation unit 66 that rotates the collet 61 around the θ-axis direction by belt driving is also mounted on the mount 62.

The collet 61 is a substantially conical body formed of a rubber or a metal. The top of the collet 61 is a flat surface. The electronic component W is to be placed on the flat surface of the collet 61. An internal passage in connected with the flat surface is formed inside the collet 61, and this internal passage is in connected with the pneumatic circuit of the negative pressure generating unit, such as a vacuum pump or an ejector. By generating negative pressure by the pneumatic circuit, the collet 61 holds the electronic component W via the flat surface, and releases the electronic component W by vacuum break or pressure relief to the ambient pressure.

The Z-axis movement mechanism 63 includes a cam unit 67, a voice coil motor 68, and compression springs 69a, 69b. The cam unit 67 moves a support frame 67a movable in the Z-axis direction in the Z-axis direction by tensioning a cam follower 67b fastened to this frame in accordance with the rotation of a cylindrical cam 67c. The voice coil motor 68, and the compression spring 69a are fastened to this support frame 67a, and the collet 61 is moved toward the holder unit 21 in the Z-axis direction in accordance with the movement of the support frame 67a in the Z-axis direction. The compression spring 69b moves the collet 51 in the Z-axis direction so as to be apart from the holder unit 21. The voice coil motor 68 absorbs excessive load to the electronic component W held between the collet 61 and the sucking nozzle, and applies a predetermined load to the electronic component W.

The voice coil motor 68 generates, by the cam mechanism 67, countervailing thrust force against the load applied to a coil bobbin 68a simultaneously with a drive to move up the collet 61 along the Z-axis direction. This countervailing thrust force countervails the load applied to the coil bobbin 68a under the state the collet 61 is not reached the electronic component W yet. The load applied to the coil bobbin 68a is a difference between the pushing force by the compression spring 69a and the pushing force by the compression spring 69b.

Hence, before the collet 61 reaches the electronic component W, the coil bobbin 68a maintains a relative positional relationship with the voice coil motor 68, and when the collet reaches the electronic component W, the coil bobbin 68a is retracted along the Z-axis direction so as to be pushed into the voice coil motor 68 by the load applied from the electronic component W when attempting to move further forward. That is, when the electronic component W abuts the collet 61, and the collet 61 attempts to move further forward, the voice coil motor 68 absorbs excessive load to be applied to the electronic component W.

The holder unit 21 and the correction unit 60 transfer the electronic component W between each other in the following scheme. In the case of the transfer of the electronic component W to the correction unit 60, no holder unit 21 is caused to protrude. Instead, the collet 61 of the correction unit 60 is protruded in the Z-axis direction to come close to the holder unit 21 for receiving the electronic component W, and sucks the electronic component W by negative pressure simultaneously with the canceling of the sucking by the holder unit.

Next, the correction unit 60 moves the collet 61 in the direction going apart from the holder unit 21 along the Z-axis, thereby retracting the electronic component W from the holder unit 21, and overlaps the retracting action and the re-protruding action to move the collet 61 in the horizontal direction (X and Y axes directions). Still further, the correction unit 60 rotates the collet 61 around the θ-axis direction, thereby correcting the attitude of the electronic component W. In addition, the correcting unit 60 causes the collet 61 to protrude again in the Z-axis direction to come close to the holder unit 21 and the sucking by the collet 61 is canceled simultaneously with the start of sucking by the holder unit 21.

(Electrical Characteristic Measuring Unit)

The electrical characteristic measuring unit 70 is a unit that measures the electrical characteristics of the electronic component W. The electrical characteristic measuring unit 70 is installed at the location two stop positions ahead from the correction unit 60. This is an opposite side to the transfer point A in the rotary pickup 2b as illustrated in FIG. 2. The electrical characteristic measuring unit 70 electrically contacts the electrode of the electronic component W, applies voltage or a current to the electronic component W, and inspects the electrical characteristics. Example electrical characteristics are the voltage, current, resistance, or frequency of the electronic component W relative to the applied current or voltage to the electronic component W, and an output signal in response to a logic signal.

The electrical characteristic measuring unit 70 includes a contact 71 that faces the holder unit 21. The contact 71 is a stage on which the electronic component W is to be placed, and electrically contacts the electrode of the electronic component W as a current-carrying contactor.

According to this electrical characteristic measuring unit 70, when the electronic component W held by the holder unit 21 moving forward from the rotary pickup 2b is pushed against the contact 71 by the forward/retract drive unit 25, the contact 71 contacts with the electrode, applies a current or a voltage, or inputs a logic signal, and analyzes an output signal. Subsequently, when the holder unit 21 is retracted, the contact 71 is released from the electronic component W.

(Optical Characteristic Measuring Unit)

The optical characteristic measuring unit 80 is a unit that measures the optical characteristics of the electronic component W that emits light like an LED. The optical characteristic measuring unit 80 is installed at the location two stop positions ahead from the electrical characteristic measuring unit 70. This is the highest point in the rotary pickup 2b that is the sub carrying structure as illustrated in FIG. 2. This highest point is the most distant location from the rotary pickup 2a that is the main carrying structure in the height direction.

Figure 7:
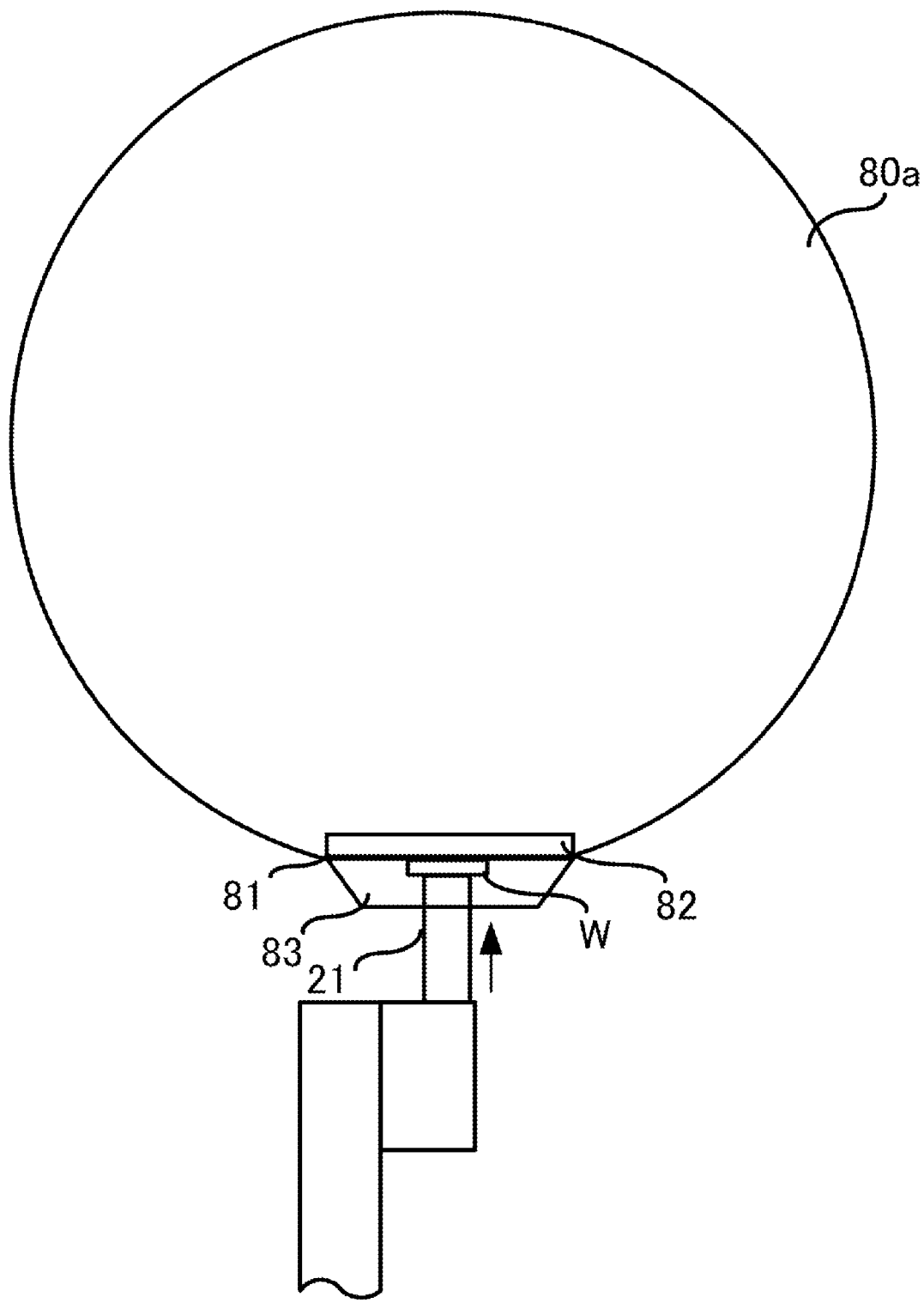
FIG. 7 is a side view illustrating an optical characteristic measuring unit.

As illustrated in FIG. 7, the optical measuring unit 80 includes an integrating sphere 80a. The integrating sphere 80a has a diffusion and reflection material applied to the internal wall surface of a hollow spherical shell formed of a metal such as aluminum. An example diffusion and reflection material applicable is a barium sulfate mixed with a binder. An opening 81 is provided at the lower portion of the integrating sphere 80a facing the holder unit 21. The dimension of the opening 81 is designed to be larger than of the electronic component W. The opening 81 is blocked off by a transparent plate 82. The transparent plate 82 may be formed of a transparent material that allows light to pass through such as a glass or a plastic.

A reflector 83 that is a reflection member is attached to the lower portion of the integrating sphere 80a so as to cover the opening 81 and the surroundings of the transparent plate 82. The reflector 83 is a member formed in a funnel shape, and decreases the diameter toward the holder unit 21 from the integrating sphere 80a, that is, toward the downward side. The reflector 83 may linearly decrease the diameter, or may decrease the diameter so as to draw a curve. The lower end of the reflector 83 that has the decreased diameter has a dimension that enables at least the tip of the holder unit 21 holding the electronic component W to enter. The reflector 83 that is the reflection member deflects the incident light to the reflector 83 from the electronic component W, and guides this light to the interior of the integrating sphere 80a. Simultaneously, the reflector 83 that also serves as a block-off member covering the opening 81 of the integrating sphere 80a, thereby preventing ambient light from entering the interior of the integrating sphere 80a.

When a light emitting test is carried out, the holder unit 21 is moved up by the forward/retract drive unit 25. Hence, the electronic component W held by the holder unit 21 enters the reflector 83, and is moved up to a position in contact with the transparent plate 82.

Although it is not illustrated in the figure, provided at the lower portion of the integrating sphere 80a is a terminal that will contact the electrode surface of the electronic component W when the electronic component W held by the holder unit 21 enters the reflector 82, and is pushed up. This terminal is coupled to an unillustrated analyzer via signal lines. The analyzer includes a power supply, a driver, and a computer, supplies power to the electronic component W, receives a signal indicating a light receiving result from the integrating sphere 80a, analyzes this signal, and obtains the optical characteristics. This terminal may be a probe installed under the integrating sphere 80a. The probe is a pair of conductive long narrow bars. The probe is moved in the axial-line direction from the lower side by an unillustrated drive unit, passes through an insertion hole formed separately from the sucking path for the sucking nozzle of the holder unit 21, and is capable of contacting with and going apart from the electrode surface of the electronic component W. Which of the terminal that is the structure at the integrating sphere 80a or the structure at the holder unit 21 like the probe is employed is decided in accordance with the direction of the electrode surface of the electronic component W held by the holder unit 21.

The electronic component W coming to the corresponding stop position to the optical measuring unit 80 is moved up toward the opening 81 of the integrating sphere 80a by the forward/retract drive unit 25, and stops at the position where the upper surface of the electronic component W contacts the transparent plate 82 provided at the opening 81 of the integrating sphere 80a. The upper side and lower side of the electronic component W are held by the transparent plate 82 and the holder unit 21, and has a stationary position. In this case, the electrode surface of the electronic component W contacts the terminal of the integrating sphere 80a. Next, the electronic component W to which power is supplied from the terminal emits light.

The light emitted upwardly from the upper surface of the electronic component W passes through the transparent plate 82, and enters the interior of the integrating sphere 80a. The light emitted from the side surface of the electronic component W to the side section or to the lower section is diffracted by the reflector 83, directed upwardly, passes through the transparent plate 82, and enters the interior of the integrating sphere 80a. The incident light to the interior of the integrating sphere 80a via the opening 81 is repeatedly reflected in the spherical integrating sphere 80a. Hence, the internal surface of the integrating sphere 80a has a uniform brightness.

The integrating sphere 80a outputs, to the analyzer, a signal indicating the amount of collected light. The analyzer obtains the optical characteristics of the electronic component W by signal analysis. The electronic component W having undergone the optical characteristic measurement is held by the holder unit 21 and is moved down by the forward/retract drive unit 25. Hence, the electronic component W goes apart from the optical characteristic measuring unit 80. In the case of the terminal is a probe, when the electronic component W is held by the transparent plate 82 and the holder unit 21 from the upper side and from the lower side, the probe is moved up to contact the electrode surface of the electronic component W, and causes the electronic component W to emit light. Next, after the end of the optical characteristic measurement, the probe is moved down, and goes apart from the electronic component W.

[3. Action]

This transfer apparatus 1 has the following action. First, the transfer apparatus 1 to be explained with reference to an example action, as illustrated in FIG. 1, and FIG. 2, includes each rotary pickup 2a, 2b that has the eight holder units 21 installed at the equal pitch on the circumference, the stage unit 4a, which the storage unit 5a storing the electronic components W is mounted on, is installed at aside of the rotary pickup 2a that is the first half of the main carrying path, and the stage unit 4b, which the storage unit 5b to store the electronic component W is mounted on, is installed at a side of the rotary pickup 2b that is the latter half of the carrying path.

The rotary pickup 2a rotates in the clockwise direction when viewed from the planar direction. That is, the main carrying path extends to the transfer point A from the pickup point B in the clockwise direction, and further extends from the transfer point A to the release point C in the clockwise direction. The rotary pickup 2b rotates in the clockwise direction when viewed from a side direction that has the release point C in the depthwise direction. That is, the sub carrying path rotates in the clockwise direction by from the transfer point A, and rounds to return back to the transfer point A.

With the pickup point B being as the first stop position, the main carrying path has the transfer point A that is the fifth stop position counted in sequence from the carrying path, and has the release point C that is the seventh stop position. On the other hand, with the transfer point A being as the first stop position, the sub carrying path has an attitude measuring point P1 where the attitude measuring unit 50 is installed as the second stop position, and has the correction point B where the correction unit 60 is installed as the third stop position. The correction unit 60 is installed at the lowest point of the rotary pickup 2b. In addition, the sub carrying path has an electrical characteristic measuring point P3 where the electrical characteristic measuring unit 70 is installed as the fifth stop position, and has an optical characteristic measuring point P4 where the optical characteristic measuring unit 70 is installed as the seventh stop position.

At the pickup point B that is the first stop position, the stage unit 4a carries the electronic component W to the pickup point B, and the holder unit 21 located at the first stop position of the rotary pickup 2a holds this electronic component W. The stage unit 4a moves the stage in the X and Y axis directions. The sequence to move the electronic component W to the pickup point B is in accordance with a control unit (unillustrated).

For example, the control unit causes the rotary pickup 2a to selectively pick up the electronic component W at the pickup point B based on map data and coordinate data. The map data includes the individual information of the electronic component W and the positional information thereon. The individual information of the electronic component W is information identifying the individual electronic component W with reference to a predetermined standard. This individual information includes information on the ranking of the sorted electronic component W in accordance with the defective or non-defective level of the electronic component W by the quality inspection carried out in advance in the preceding process. This ranking is classified into a plurality of classes. The quality inspection includes at least either of the probe inspection or the visual inspection. In addition, the positional information of the electronic component W is relative positional information in the row and the column directions of each electronic component W relative to the reference point on the wafer.

More specifically, the map data can be represented as raster data including information indicating in which row and column each electronic component W is located, and information in which ranking, like rankings A to D, the electronic component W to be a product falls.

The coordinate data is positional information of each electronic component W when the wafer sheet D is set on the stage unit 4a. Based on this coordinate data, the positioning of the electronic component W relative to the holder unit 21 is made. In this embodiment, as will be explained later, the relative movement to the holder unit 21 is achieved by the movement of the ring moving unit 42 to which the wafer ring 42b on which the wafer sheet D is attached is set. The coordinate data can be obtained as coordinate values (x, y, θ) of the encoder information by the ring moving unit 42.

When, for example, the electronic components W are attached on the wafer sheet D that is the storage unit 5a, the electronic components W are stored in a two-dimension. In this case, when the electronic component W is left in an X-column, the ring moving unit 42 moves the ring holder 42a in one direction in the X-axis direction by a pitch, and does not move the stage in the Y-axis direction. When all electronic components W with the desired ranking are taken out from the electronic components W in the X-column, in order to transfer the electronic components W in sequence for the next Y-row, the ring moving unit 42 moves the ring holder 42a in the opposite direction to the X-axis direction by the amounts corresponding to all rows, and moves the stage in one direction of the Y-axis direction aby a pitch.

In addition, the forward/retract drive unit 25 protrudes the holder unit 21 in the centrifugal direction toward the electronic component W present at the pickup point B along the radial direction of the rotary pickup 2a. The holder unit 21 is guided in the pickup radial direction by the sliding unit 24. When the holder unit 21 abuts a surface of the electronic component W, negative pressure is generated inside the nozzle by the vacuum generator, enabling the holder unit 21 to hold the surface of the electronic component W. When the holder unit 21 holds the electronic component W, the forward/retract drive unit 25 cancels the drive force that moves forward the holder unit 21. Next, the spring 25h retracts the holder unit 21 holding the electronic component W in the centripetal direction.

At the transfer point A that is the fifth stop position, the holder unit 21b of the rotary pickup 2b that is the sub carrying path approaches the electronic component W. The holder unit 21a that is holding the electronic component W releases the electronic component W by vacuum break or blowing, and the approaching holder unit 21b has negative pressure generated inside the nozzle by the vacuum generator, and holds an opposite surface R of the electronic component W directed outwardly in the pickup radial direction.

In this case, the forward/retract drive unit 25 that is moving forward the holder unit 21b controls the moving-forward speed of the holder unit 21b and the load applied to the electronic component W from the holder unit 21b. That is, the rotation motor 25d of the forward/retract drive unit 25 decreases the rotation speed as the moving-forward holder unit 21b comes closer to the holder unit 21a that is holding the electronic component W to decelerate the moving-forward speed of the holder unit 21b, and when the tip of the holder unit 21b is about to abut the electronic component W, the moving-forward speed is set to be zero. The deceleration may be linear or may be stepwise. In addition, when the holder unit 21b abuts the electronic component W, the rotation motor 25d of the forward/retract drive unit 25 adjusts the thrust force by the voice coil motor 25g, and makes the load applied to the electronic component W close to zero.

Figure 8:
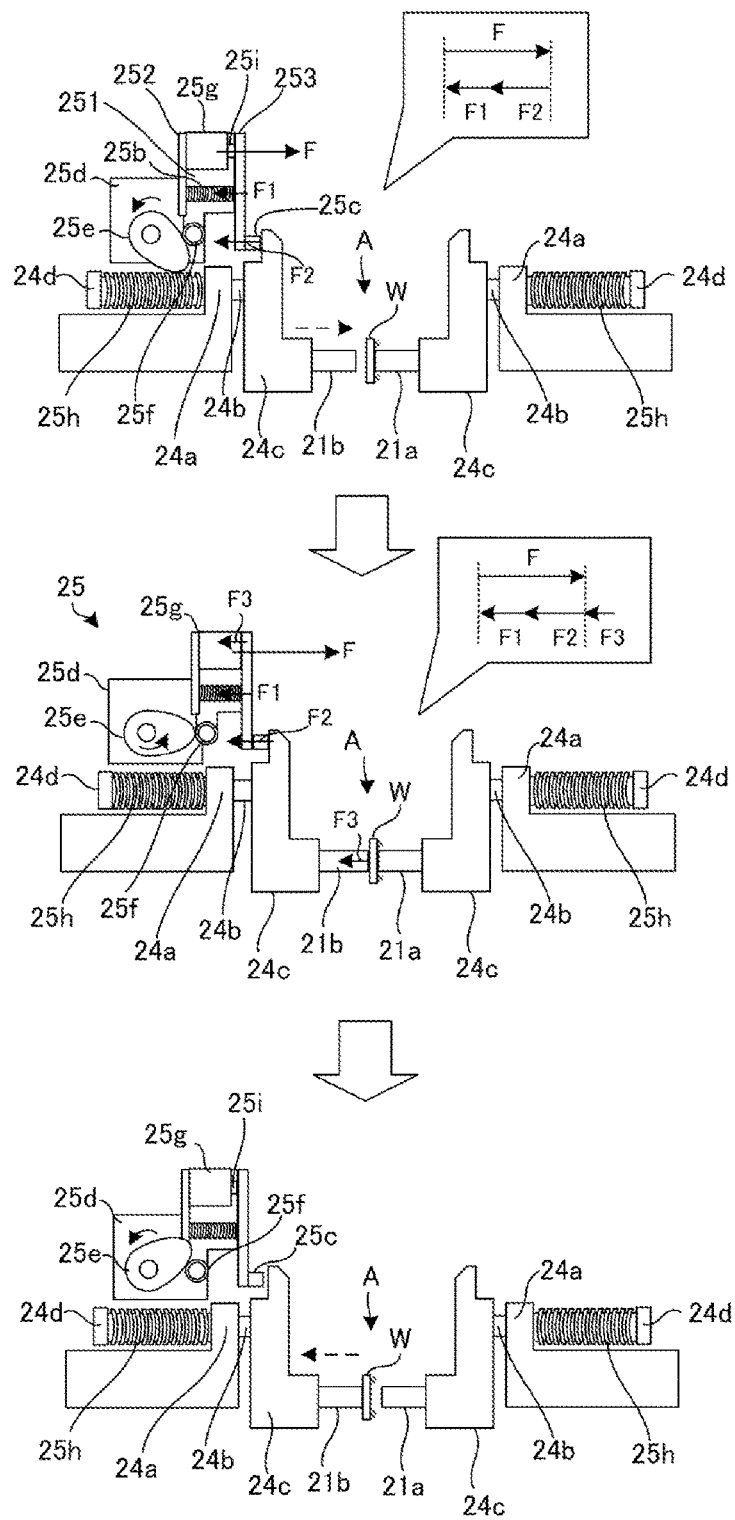
FIG. 8 is an exemplary diagram illustrating an action of the forward/retract drive unit.

More specifically, as illustrated in FIG. 8, the forward/retract drive unit 25 rotates the cylindrical cam 25e by the actuation of the rotation motor 25d. The cam follower 25f is caused to pass through the expanded cam surface portion, and the slide member 250 to which the cam follower 25f is attached is pushed outwardly in the radial direction. The protrusion 25c of the protrusion support plate 253 coupled to the slide member 250 abuts the arm 24c at certain time point, and pushes out the holder unit 21b together with the arm 24c. The holder unit 21b is guided by the sliding unit 24, and moves forward toward the electronic component W held by the awaiting holder unit 21a.

In this case, the rotation motor 25d of the forward/retract drive unit 25 rotates at a fast rotation speed so as to move the holder unit 21b at a fast speed until right before the tip of the holder unit 21b reaches the electronic component W, rotates at a slow rotation speed so as to move the holder unit 21b at a slow speed, and sets the speed to be zero when the holder unit 21b reaches a location abutting the electronic component W. In addition, a difference in torque control is set before and after the holder unit 21b reaches the electronic component W. After when the tip of the holder unit 21b is about to contact the electronic component W, the torque control is strongly restricted so as to reduce the maximum torque. As for such speed and torque control, the amount of rotation for the rotation motor 25d associated with the combination information on the facing holder units 21a, 21b, or the stop point information like the transfer point A, etc., is referred. Hence, an application of excessive load to the electronic component W is avoidable beforehand.

In addition, the voice coil motor 25g is applying, to the rod 25i, a thrust force F countervailing the total of a resistance force F1 applied to the rod 25i when the holder unit 21b that is not reached the electronic component W yet is moved forward, and a compression force F2 by the spring 25b that supports the protrusion support plate 253. Hence, the rod 25i does not move forward, and is not pushed in the casing of the voice coil motor 25g.

When, however, the tip of the holder unit 21b abuts the electronic component W, and gets a new resistance force F3 is from the electronic component W, the rod 25i is pushed in the voice coil motor 25g. That is, the voice coil motor 25g absorbs an impact originating from the contact between the holder unit 21b and the electronic component W by pushing in the rod 25i into the motor casing. Therefore, a load applied to the electronic component W from the holder unit 21b is remarkably reduced.

Hence, depending on the positioning error, the respective positions of the holder units 21a, 21b may be displaced at the transfer point A, and the one point becomes a support point, while the other point becomes a point of effort, causing a rotational moment to the electronic component W in some cases. According to this forward/retract drive unit 25, however, since a load applied to the electronic component W becomes close to zero, an occasion in which the attitude of the electronic component W is misaligned or in the worst case the electronic component W laterally falls down is avoidable.

At the attitude measuring point F that is the second stop position in the sub carrying path, the attitude of the electronic component W is measured, and the displacement of the electronic component in the X, Y, and θ axis directions is detected. The attitude measuring unit 50 at this attitude measuring point F calculates the displacement from the image of the electronic component W taken by the imaging optical system. The displacement is calculated by measuring the distance to each point on the electronic component W relative to a reference point in the image. The information on the displacement amount in the X, Y and θ axis directions is stored in association with the electronic component W.

At the correction point P2 that is the third stop position in the sub carrying path, when the electronic component W having undergone the attitude displacement measurement stops at the position facing the correction unit 60, this electronic component W is transferred from the holder unit 21b to the correction unit 60, an attitude displacement correction is performed. Subsequently, the electronic component W is returned to the holder unit 21b. That is, the correction unit 60 moves and rotates the electronic component W based on the movement amount in the X and Y axis directions and the rotation amount around the θ-axis direction calculated based on the attitude displacement.

At the electrical characteristic measuring point P3 that is the fifth stop position in the sub carrying path, the electronic component W having undergone the attitude correction is pushed against the contact 71 of the electrical characteristic measuring unit 70 by the holder unit 21b. When the contact 71 is in contact with the electrode of the electronic component W, the electrical characteristics are measured. Next, when the holder unit 21b is retracted in the centripetal direction, the contact goes apart from the electronic component W.

At the optical point measuring point P4 that is the seventh stop position in the sub carrying path, the electronic component W is pushed against the transparent plate 82 of the optical characteristic measuring units 80 by the holder unit 21b. Next, the probe 38 contacts the electrode surface of the electronic component W, and the electronic component W emits light. Hence, the optical characteristics are measured. Subsequently, when the holder unit 21b is retracted in the centripetal direction, the electronic component W goes apart from the optical characteristic measuring unit 80.

At the transfer point A, the holder unit 21a of the rotary pickup 2a that is the main carrying path approaches the electronic component W. The holder unit 21b that is holding the electronic component W releases the electronic component W by vacuum break or blowing, and the approaching holder unit 21a has negative pressure generated inside the nozzle by the vacuum generator, and holds the surface of the electronic component W opposite to the opposite surface R and directed outwardly in the pickup radial direction.

In this case, the forward/retract drive unit 25 that is moving forward the holder unit 21a controls the moving-forward speed of the holder unit 21a and the load applied to the electronic component W from the holder unit 21a similarly to the transfer case from the rotary pickup 2a to the rotary pickup 2b.

At the release point C that is the eighth stop position in the main carrying path, the stage unit 4b carries the placement location to the release point C, and the eighth holder unit 21a of the rotary pickup 2a releases the electronic component W. The stage unit 4b moves the stage in the X and Y axis directions, and rotates around the θ-axis direction. The movement in the X-axis direction is by a pitch in one direction alone when an empty placement location is still left in the X-column. The movement in the Y-axis direction is by a pitch in one direction alone when there is no empty placement location in the X-column.

When the stage is moved beforehand in the X and Y axis directions and around the θ-axis direction, and this movement completes, the forward/retract drive unit 25 moves forward the holder unit 21a located at the release point C that is the eighth stop position, and releases the electronic component W to the placement location. In the case of the wafer sheet D mounted on the stage unit 4b, the electronic component W is attached on the wafer sheet D.

For example, the electronic component W with a specific ranking stopped at the position facing the wafer sheet D is attached on the wafer sheet D by the moving-forward and retracting holder unit 21a. In this case, the ring moving unit 42 is actuated so as to attached the electronic component W in sequence from the start end of the pasting area of the expanded wafer sheet D. For example, a plurality of parallel scan lines set from the start end of the pasting area to the opposite end thereof are scanned to attach the electronic components W in the reciprocating action. Hence, the electronic components W with the specific ranking are collected on the wafer sheet D.

[4. Action and Effect]

As explained above, according to this embodiment, the transfer apparatus 1 takes out the electronic component W from the one storage unit 5a, and places this electronic component W in the other storage unit 5b. This transfer apparatus 1 includes the holder unit 21 that holds and releases the electronic component W via a tip, and the two rotary pickups 2a, 2b each including a plurality of the holder units 21 around the rotation axis, and intermittently rotating by a predetermined angle around the rotation axis so as to always direct the tip of the holder unit 21 outwardly. The one rotary pickup 2a is a main carrying structure that forms the main carrying path for the electronic component W from the one storage unit 5a to the other storage unit 5b. The rotary pickup 2b adjacent to this main carrying structure is the sub carrying structure installed so as to not overlap the main carrying structure and to have an orthogonal rotation axis to that of the rotary pickup 2a. In addition, the tips of the respective holder units 21a, 21b of the main carrying structure and the sub carrying structure have the common stop position where the respective holder units face with each other, and only this stop position is set as the transfer point A. The electronic component W is transferred at this transfer point A in both directions.

As explained above, since the rotary pickups 2a, 2b are installed adjacent to each other on the orthogonal planes so as to not overlap with each other and to have the respective rotation axes orthogonal to each other, the increase ratio of the number of process points relative to the increased number of rotary pickups 2b can be remarkably increased.

Figure 13:
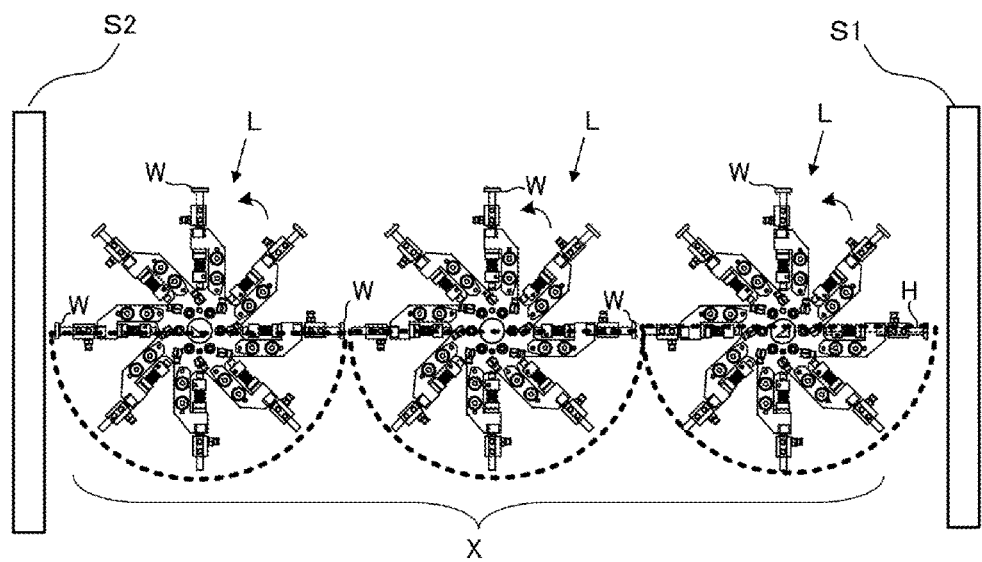
FIG. 13 is an exemplary diagram illustrating a conventional transfer apparatus.

That is, as illustrated in FIG. 13 explained above, when a plurality of the rotary pickups are installed adjacent to each other on the same plane with the respective rotation axes in parallel with each other, an increase of only one process point is expectable per a rotary pickup. In addition, every time the additional rotary pickup is installed, the installation space in the horizontal direction increases.

Figure 9:
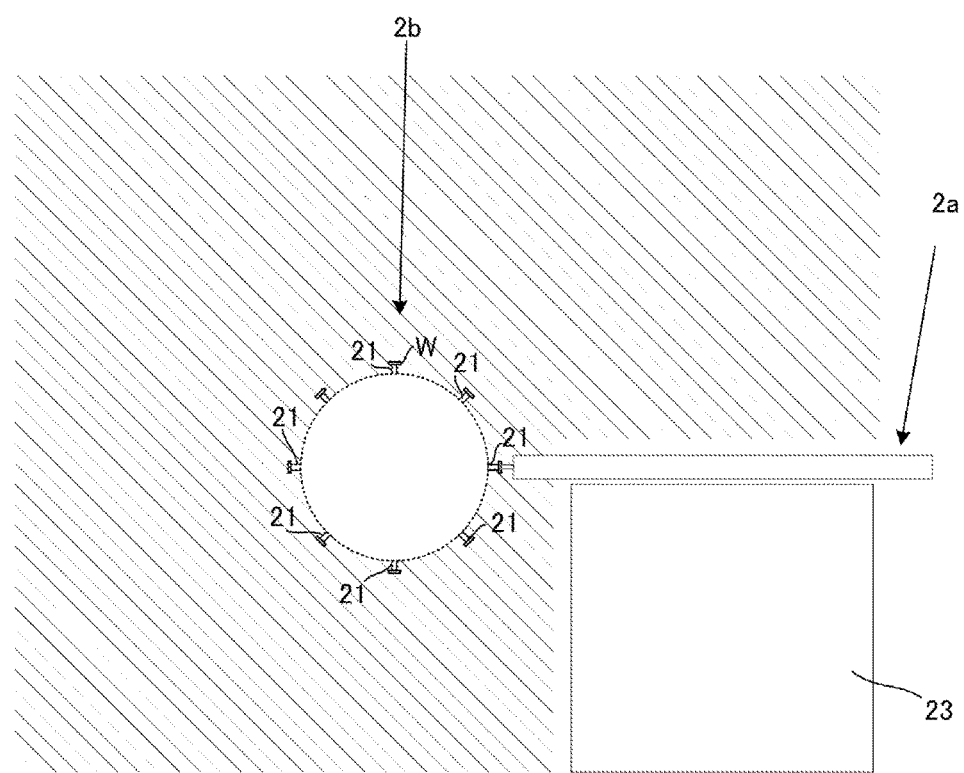
FIG. 9 is an exemplary diagram illustrating a space around a sub carrying structure.

Conversely, according to this embodiment, the rotary pickup 2a that is the main carrying structure and the rotary pickup 2b that is the sub carrying structure are installed in directions in which the respective rotation axes are orthogonal to each other, and the single transfer point A is set. Hence, the holder units 21a, 21b of the respective rotary pickups 2a, 2b rotate on two planes which have no overlap and which are in different directions. Hence, as illustrated in FIG. 9, the rotary pickup 2b that is the sub carrying structure has a widespread available space around such rotary pickup. Accordingly, the number of holder units 21 that has an empty space ahead of the tip on the extended line therefrom increases. In the above structure, the number of process points per the rotary pickup 2b that is the sub carrying structure is increased by four. In addition, in the main carrying path, also, the stop positions other than the storage units 5a, 5b, and the transfer point A are empty, and thus at least one process point can be increased. Therefore, the increase ratio of the number of process points relative to the increased number of rotary pickups 2b remarkably increases.

In addition, the sub carrying structure has a diameter of the rotation plane smaller than that of the main carrying structure. Hence, the available space around the sub carrying structure is increased. For example, as illustrated in FIG. 9, the distance from the tip of the rotary pickup 2b that is the sub carrying structure to the motor 23 that is the drive source for the rotary pickup 2a which is the main carrying structure and the installation plane of the drive source can be extended. Accordingly, the increase ratio of the number of installation spaces for the process unit relative to the increased number of rotary pickups 2b is also increased. This eliminates a constraint to the dimension of the installable process unit.

Still further, the main carrying structure is installed laterally, and the rotation trajectory of the holder unit 21a is horizontal, while the sub carrying structure is installed longitudinally, and the rotation trajectory of the holder unit 21b is vertical. Therefore, the lower space of the sub carrying structure can be increased.

The process unit that performs a predetermined process on the electronic component W is installed at, at least one stop position that faces the tip of the holder unit 21a of the sub carrying structure. This process unit includes the attitude measuring unit 50 that measures the attitude displacement of the electronic component W, the correction unit 60 that corrects the attitude of the electronic component W based on the measured attitude displacement by the attitude measuring unit 50, and an inspection unit that inspects the characteristics of the electronic component W. This inspection unit includes the optical characteristic measuring unit 80 including the integrating sphere 80a, and the electrical characteristic measuring unit 70. In addition, a visual inspection unit, etc., is also installable.

Hence, by simply adding the single rotary pickup 2b as the sub carrying structure, at least three types of process units are installable. In particular, even in the case of the optical measuring unit 80 that has the integrating sphere 80a that requires a relatively large space, such unit is installable on the rotary pickup 2b on which other process units have been installed. In addition, since the carrying directions by the respective holder units 21 are orthogonal to each other, even if a misalignment of the holder units 21 occurs at the transfer point A, the correction unit 60 is capable of collecting such a misalignment.

Either one or both of the storage units 5a, 5b are the wafer sheet D on which the electronic components W are attached, and stage units 4a, 4b that are support units for the wafer sheet D are installed at respective locations where the respective tips of the holder units 21 face with each other in the direction in which the wafer sheet D is orthogonal to the rotation radius of the main carrying structure.

Since the support unit for the wafer sheet D has an area in the planar direction orthogonal to the rotation radius of the main carrying structure, an interference between the rotation plane of the main carrying structure and the unit in the parallel direction is likely to occur. However, since the sub carrying structure is in the orthogonal direction to the main carrying structure, an interference with the support unit for the wafer sheet D is avoidable.

In addition, according to this transfer apparatus 1, either one of the holder units 21 facing with each other at the transfer point A feeds or receives the electronic component W to be transferred, and the forward/retract drive unit 25 decelerates the moving speed of the moving-forward holder unit 21 as coming close to the other facing holder unit 21. Still further, the load applied to the electronic component W to be transferred from the moving-forward holder unit 21 is controlled.

Accordingly, since the carrying directions of the holder units 21 at the feeding side and at the receiving side are orthogonal to each other, even when a misalignment of the holder units 21 at the transfer point A occurs, a rotational moment to the electronic component W caused by a shifting of the points to which loads are respectively applied at the front and back sides of the electronic component W is quite small. This does not cause a change in attitude of the electronic component W during the a transfer, and a lateral fall down of the electronic component W resulting in an unsuccessful transfer. In view of this point, also, an excellent yield of the electronic component W can be achieved, and the apparatus that has an excellent workability can be achieved.

[5. Modified Examples]

For example, this transfer apparatus 1 may have the rotary pickup 2a which is the main carrying structure installed longitudinally in the vertical direction. This transfer apparatus 1 may have the rotary pickup 2b which is the sub carrying structure installed laterally in the horizontal direction.

The applicable process units to be installed at the process points are, in addition to the examples explained in the above embodiment, other various types of process units, such as visual inspection, adhesive application, forcible ejection of defective products, mounting on a substrate, temperature adjustment like heating or cooling, shaping of a terminal extended from the electronic component W, and marking.

As for the holder unit 21, in addition to the sucking nozzle that sucks or releases the electronic component W by generation of vacuum or vacuum break or generation of positive pressure, an electrostatic sucking type, a Bernoulli chuck type, or a chuck unit that mechanically holds the electronic component W may be applied.

In addition, the number of holder units 21 installed on the respective rotary pickups 2a, 2b is not limited to that of the above embodiment. A number of a plurality of the holder units 21 applicable is a number sufficient to enable the transfer and the process. The type of the holder unit 21 is not limited to one type, and two types of holder units 21 may be installed. For example, the same types of the holder units 21 may be installed alternately at the odd-number positions and at the even-number positions. When a first type of electronic component W is supplied, the holder unit 21 at the odd-number position picks up this electronic component W, and when a second type of electronic component W is supplied, the holder unit 21 at the even-number position picks up this electronic component W. When the same types of electronic components W are supplied in sequence, the rotary pickups 2a, 2b are each rotated two pitches by two pitches, and when a different type of electronic component W is supplied, the rotary pickups 2a, 2b are each rotated by a pitch, and hold this different type of electronic component W. In the case of small-lot production for multiple types of electronic components, when a change in type frequently occurs, a work to replace the holder unit 21 in accordance with the type of the electronic component W is unnecessary, resulting in an improvement of the production efficiency.

Still further, in the above embodiment, at the transfer point A, in the case of the transfer from the main carrying path to the sub carrying path, a scheme of causing the holder unit 21b of the rotary pickup 2b to receive the electronic component W is adopted, and in the case of the transfer from the sub carrying path to the main carrying path, a scheme of causing the holder unit 21a of the rotary pickup 2a to receive the electronic component W are adopted. However, the feeding and receiving relationship may be inverted. In such cases, the forward/retract drive units 25 are installed on both the rotary pickups 2a, 2b. In addition, the one holder unit may always receive, while the other holder unit may always feed. In this case, the forward/retract drive unit 25 may be installed on either of the main carrying path or the sub carrying path only.

Figure 10:
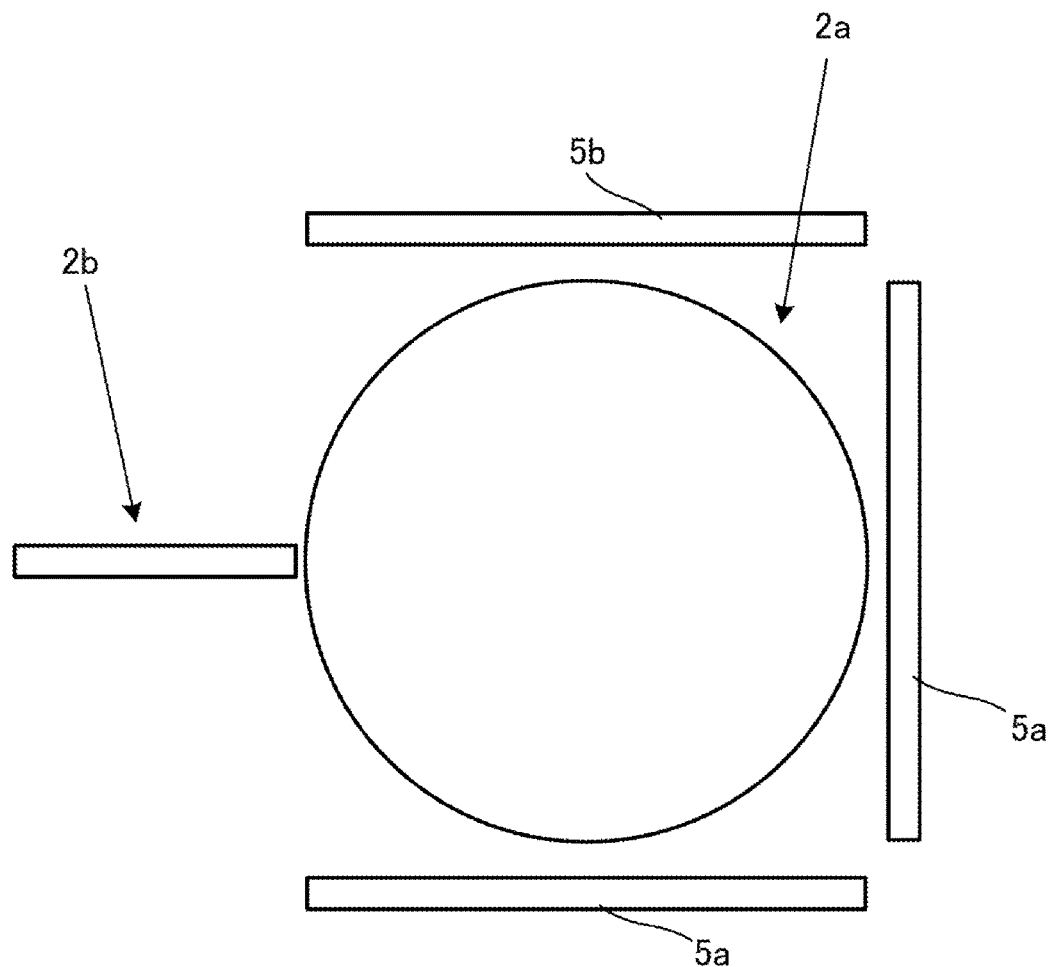
FIG. 10 is an exemplary diagram illustrating another example of the transfer apparatus.

Yet still further, in the above embodiment, the storage unit 5a is the wafer sheet D at the supply side of the electronic component W, while the storage unit 5b is the wafer sheet D at the collecting side of the electronic component W. However, the plurality of the storage units 5a or the plurality of the storage units 5b may be provided. For example, as illustrated in FIG. 10, the two storage units 5a of the supply side may be installed at the two stop positions for the holder unit 21 in the first half of the main carrying path. In this case, when the electronic component W in the one storage unit 5a at the supply side run out, the electronic components W can be continuously supplied from the other storage unit 5a while the empty storage unit 5a is in replacement.

Figure 11:
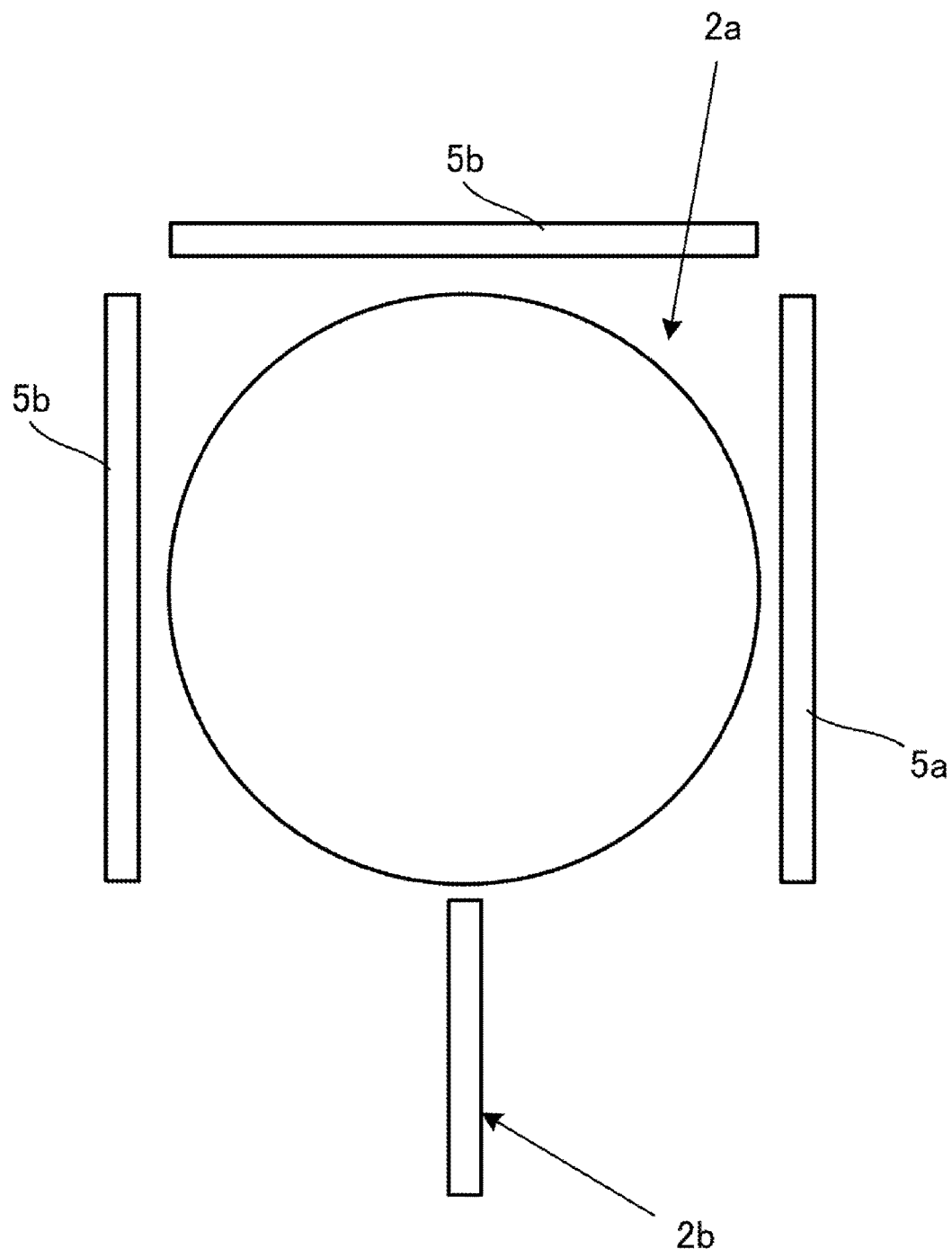
FIG. 11 is an exemplary diagram illustrating another example of the transfer apparatus.

Moreover, as illustrated in FIG. 11, the two storage units 5b at the collecting side may be installed at the two stop positions for the holder unit 21 in the latter half of the main carrying path. In this case, the electronic components W with different types and different rankings may be sorted into the two storage units 5b.

Figure 12:
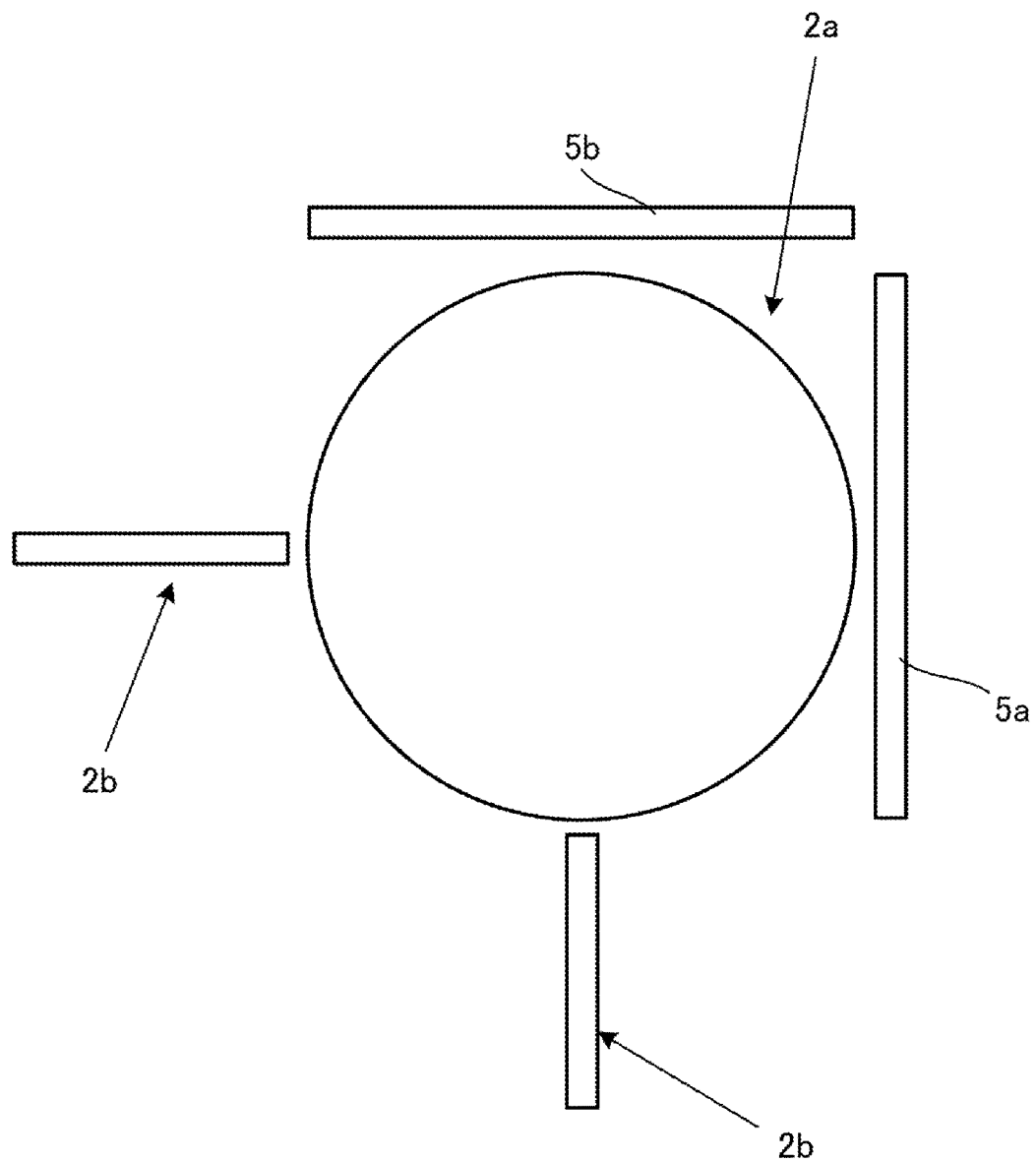
FIG. 12 is an exemplary diagram illustrating another example of the transfer apparatus.

The installation of the rotary pickup 2b that is the sub carrying structure is not limited to the above location, and the rotary pickup 2b may be installed at any one of the stop positions for the holder unit 21a of the rotary pickup 2a. As for the number of the rotary pickups 2a, 2b, N number (where N≥2) may be applied. For example, the plurality of the rotary pickups 2b that are the sub carrying structures may be provided to a plurality of the rotary pickups 2a. For example, as illustrated in FIG. 12, by providing the plurality of the rotary pickups 2b that are the sub carrying structures to the plurality of the stop positions for the holder unit 21 of the rotary pickup 2a, the number of process points can be further remarkably increased while suppressing an increase in installation space.

The storage unit 5a, 5b is not limited to the wafer sheet D. An adhesive sheet, a thermal release sheet, a lead frame, an organic-based substrate, an inorganic-based substrate, an adhesive tray, a board, a parts feeder, a tape formed with pockets, a tray, a sorting bottle, and a combinations thereof is applicable.

[6. Other Embodiments]

Each embodiment of the present invention and the modified forms thereof have been explained above, but various omissions, replacements, modifications, and combinations can be made without departing from the scope of the present invention. Such embodiments and modified forms thereof are within the scope of the present invention, and also within the scope of the invention as recited in the appended claims and the equivalent range thereto.

REFERENCE SIGNS LIST

1 Transfer apparatus
2a, 2b, L Rotary pickup
21, 21a, 21b Holder unit
22 Axial frame
23 Motor
24 Sliding unit
24a Sleeve
24b Slide shaft
24c Arm
24d Flange
25 Forward/retract drive unit
250 Slide member
251 Side plate
252 Celling plate
253 Protrusion support
25b Spring
25c Protrusion
25d Rotation motor
25e Cylindrical cam
25f Cam follower
25g Voice coil motor
25h Spring
25i Rod
4a, 4b Stage unit
42 Ring moving unit
42a Ring holder
42b Wafer ring
43 Expand unit
43a Pull unit
44 Separation unit
45 Imaging optical system
45a Imaging unit
45b Optical member
5a, 5b, S1, S2 Storage unit
50 Attitude measuring unit
60 Correction unit
61 Collet
62 Mount
63 Z-axis movement unit
64 X-axis movement unit
65 Y-axis movement unit
66 θ-axis rotation unit
67 Cam unit
67a Support frame
67b Cam follower
68 Voice coil motor
68a Coil bobbin
69a, 69b Compression spring
70 Electrical characteristic measuring unit
71 Contact
80 Optical characteristic measuring unit
80a Integrating sphere
81 Opening
82 Transparent plate
83 Reflector
D Wafer sheet
A Transfer point
B Pickup point
C Release point
P1 Attitude measuring point
P2 Correction point
P3 Electrical characteristic measuring point
P4 Optical characteristic measuring point
H Holder unit
W Electronic component
F Thrust force by voice coil motor
F1 Resistance force applied to rod
F2 Compression force
F3 New resistance force

The invention claimed is:

1. A transfer apparatus comprising:
a carrying path for an electronic component, the carrying path being formed between a first storage unit and a second storage unit;
a plurality of holder units, each holder unit being constructed to hold and release the electronic component via a respective tip; and
N number (where N≥2) of rotary pickups, each rotary pickup supporting a respective set of the holder units around a rotation axis of the rotary pickup, and intermittently rotating around the rotation axis by a predetermined angle so as to always direct the respective tip of each holder unit radially outward,
wherein:
the respective tip of each holder unit comprises a sucking nozzle having an axis along the radial direction of the respective rotary pickup;
each sucking nozzle being constructed to move forward along the radial direction of the respective rotary pickup away from a center of the respective rotary pickup, and to retract along the radial direction toward said center,
at least one of the rotary pickups is a first rotary pickup that is a part of the carrying path;
one of the rotary pickups adjacent to the first rotary pickup is a second rotary pickup installed so as to not overlap with the first rotary pickup when viewed in a direction of the rotation axis of the second rotary pickup and to have the respective rotation axes orthogonal to each other, the second rotary pickup being another part of the carrying path;
the first storage unit comprises a wafer sheet on which the electronic component is attached and from which the electronic component is picked up by suction via the sucking nozzle of one of the holder units;
the first rotary pickup and the second rotary pickup have a common stop position where one of the sucking nozzles of the first rotary pickup faces one of the sucking nozzles of the second rotary pickup, and the facing sucking nozzles transfer the electronic component by respectively sucking a first surface of the electronic component and a second surface of the electronic component opposite to the first surface with the common stop position as a transfer position.

2. The transfer apparatus according to claim 1, wherein the second storage unit also comprises a wafer sheet, onto which the electronic component is attached after traversing the carrying path.

3. The transfer apparatus according to claim 1, wherein the second storage unit is a tape formed with a pocket.

4. The transfer apparatus according to claim 1, wherein the first rotary pickup is installed laterally, and a rotation trajectory of the respective set of holder units is horizontal.

5. The transfer apparatus according to claim 1, wherein the first rotary pickup is installed longitudinally, and a rotation trajectory of the respective set of holder units is vertical.

6. The transfer apparatus according to claim 1, wherein a process unit that performs a predetermined process on the electronic component is installed to at least one stop position for the set of holder units of the second rotary pickup.

* * * * *